(12) United States Patent
Yoshimura et al.

(10) Patent No.: US 11,452,205 B2
(45) Date of Patent: Sep. 20, 2022

(54) ULTRASONIC PROBE, AND ULTRASONIC TRANSMITTER-RECEIVER SYSTEM USING THE SAME

(71) Applicant: HITACHI, LTD., Tokyo (JP)

(72) Inventors: Yasuhiro Yoshimura, Tokyo (JP); Akifumi Sako, Tokyo (JP); Makoto Fukada, Tokyo (JP); Masahiro Sato, Tokyo (JP)

(73) Assignee: Fujifilm Healthcare Corporation, Chiba (JP)

( * ) Notice: Subject to any disclaimer, the term of this patent is extended or adjusted under 35 U.S.C. 154(b) by 415 days.

(21) Appl. No.: 16/781,219

(22) Filed: Feb. 4, 2020

(65) Prior Publication Data

US 2020/0359495 A1   Nov. 12, 2020

(30) Foreign Application Priority Data

May 8, 2019   (JP) .............................. JP2019-088518

(51) Int. Cl.
  *H05K 1/11*   (2006.01)
  *G01N 29/24*   (2006.01)
  *G01N 29/22*   (2006.01)
  *H05K 1/02*   (2006.01)

(52) U.S. Cl.
  CPC ........... *H05K 1/113* (2013.01); *G01N 29/223* (2013.01); *G01N 29/24* (2013.01); *H05K 1/0281* (2013.01); *H05K 1/118* (2013.01)

(58) Field of Classification Search
  CPC ........ H05K 1/111; H05K 1/113; H05K 1/115; H05K 1/189; H05K 1/0281; H05K 2201/1059; H05K 2201/10083; H05K 2201/09072; H05K 2201/2009; G01N 29/04; G01N 29/0654
  See application file for complete search history.

(56) References Cited

FOREIGN PATENT DOCUMENTS

JP   2002-341786 A   11/2002
WO   WO-2013122075 A1 *   8/2013   ............... A61B 8/14

* cited by examiner

*Primary Examiner* — Paresh Paghadal
(74) *Attorney, Agent, or Firm* — Baker Botts L.L.P.

(57) ABSTRACT

Provided is an ultrasonic probe having ultrasonic elements and a printed-circuit board that establishes connection between the ultrasonic elements and external wiring, achieving strong connection between the ultrasonic elements and the printed-circuit board mechanically and electrically, and thereby improving performance in examination and diagnosis using the ultrasonic probe. The printed-circuit board with pads each having a via-hole to be bonded to electrode pads of a chip equipped with the ultrasonic elements, is provided with a reinforcement, in an area of the base material where the pad having the via-hole is not formed. The reinforcement is formed simultaneously with forming the pads and wiring on the printed-circuit board, having the same thickness as the pads. With the reinforcement, pressure is evenly applied to the printed-circuit board when the electrode pad is press-fitted into the pad having the via-hole, thereby preventing warping and deforming of the board.

15 Claims, 18 Drawing Sheets

ULTRASONIC PROBE, AND ULTRASONIC TRANSMITTER-RECEIVER SYSTEM USING THE SAME

INCORPORATION BY REFERENCE

The present application claims priority from Japanese patent application JP-2019-88518 filed on May 8, 2019, the content of which is hereby incorporated by reference into this application.

BACKGROUND OF THE INVENTION

Field of the Invention

The present invention relates to an ultrasonic probe used for a system such as an ultrasonic sensor or an ultrasonic diagnostic system. More particularly, the present invention relates to improvements of a wiring-connection structure of ultrasonic elements incorporated in the ultrasonic probe.

Description of the Related Art

An ultrasonic probe is widely used, for example, for functioning as a tactile sensor simulating a human hand or a touch sensor, an ultrasonic probe for detecting an internal defect of a structural material, and a probe of an ultrasound diagnostic system used for medically diagnosing human body or animals.

In general, the ultrasonic probe has a structure comprising a chip having a substrate with an array of a large number of ultrasonic elements thereon, provided with electrode pads (connecting terminals) respectively connected to the ultrasonic elements, and a printed-circuit board with pads and signal lines formed thereon, the pads being associated with the electrode pads on the chip and the signal lines establishing connection between the pads and external wirings, in a manner that electrically connects the electrode pads on the chip with the pads on the printed-circuit board. The ultrasonic element employed as described above may be, for example, a PMUT (Piesoelectric Micro-machined Ultrasonic Transducer) using a piezo element, or a CMUT (Capacitive Micro-machined Ultrasonic Transducer) using a capacitive transducer. In recent years, the CMUT is employed in many cases. Typically, an acoustic lens is attached to the ultrasonic-element side of the chip, and a backing material is bonded to the backside of the chip.

Conventionally, for the connection between the electrode pads of the chip and the pads of the printed-circuit board, there has been employed a method of wire bonding. However, following problems have been found. That is, since the wire bonding needs space for the wires, this space hampers downsizing of the ultrasonic probe; and since the wire provides protrusions on the surface of the probe, these protrusions are prone to cause pains and discomfort on an examinee (subject), when the probe of an ultrasonic diagnostic system is pressed against the subject. In order to address those problems, there have been developed connection methods as alternatives to the wire bonding.

In general, there have been developed various methods to establish connection between multiple electrode terminals on the chip provided with elements, and the printed-circuit board. For example, Japanese Unexamined Patent Application Publication No. 2002-341786 (hereinafter, referred to as Patent Literature 1) discloses a technique that the electrode terminals on the chip side are connected to a group of connection pads on the printed-circuit board side, via an anisotropic conductive film. In Patent Literature 1, there are described the following techniques; in establishing the connection, the array pitch of the connection pads is made to vary from the center towards the ends, in order to absorb change in dimension due to thermal press fitting, and dummy pads are placed into an interstice between the connection pads, so as to improve adhesiveness with the anisotropic conductive film.

The chip provided with the ultrasound elements, as a component of the ultrasonic probe, has a backing material on the backside of the chip, and the material is made of resin and similar substances. Therefore, it is difficult to employ the thermal press fitting method where heating is necessary as described in Patent Literature 1. In order to address the issue, it is suggested by the inventors of the present application, a method (hereinafter, referred to as "bump press-fitting method") where a bump is formed on each of the electrode pads on the chip side equipped with ultrasonic elements, a via hole is provided in each of the pads formed on a flexible printed circuit (FPC), and when an acoustic lens is attached to the top surface of the chip, the bumps on the chip side are press-fitted into the via holes. This method allows prevention of cracks on the chip upon bonding, thereby providing an ultrasonic probe with mechanical and electrical reliability.

The chip with the ultrasound elements thereon has a quadrilateral shape, for example, where a wiring pattern is formed, serving as signal lines provided along the array directions of the ultrasonic elements, arranged in the line direction and in the row direction of the quadrilateral array. That is, the chip is structured in such a manner that the electrode pads are provided on the ends of the wiring pattern, and there is no electrode pad on the portions corresponding to the four corners of the quadrilateral shape. When the chip provided with the ultrasonic elements having such a structure is bonded to the FPC according to the aforementioned bump press-fitting method, the areas of the FPC respectively corresponding to the four corners where no electrode pad is provided are liable to be warped or deformed due to the pressure at the time of press-fitting. If the FPC is warped, force is not applied evenly to the portions of bump fitting, and this may cause a contact failure. The surface of the ultrasonic probe may be affected by the deformed FPC, and this may hinder even contact of the probe with the subject, when the probe is brought into contact with the subject.

An objective of the present invention is to provide the ultrasonic probe that is fabricated according to the bump press-fitting method, preventing component materials from being warped and deformed at the time of press-fitting, thereby further enhancing reliability of the ultrasonic probe.

SUMMARY OF THE INVENTION

In order to achieve the objective above, an ultrasonic probe of the present invention features that an FPC has an area in association with a non-bump area of a chip, and the area is provided with a means for increasing stiffness (stiffness reinforcement) of the FPC.

The ultrasonic probe of the present invention comprises a chip having a plurality of ultrasonic elements and a plurality of connecting terminals respectively connected thereto, and a flexible printed circuit having an opening for exposing the plurality of ultrasonic elements and provided with pads along the opening, respectively associated with the plurality of connecting terminals, wherein the connecting terminals and the pads are connected by press-fitting bumps provided on the connecting terminals into via holes provided in the pads, and a first area on a surface of the flexible printed circuit, facing to a second area of the chip where no connecting terminal is formed, is provided with a stiffness reinforcement for increasing stiffness of the flexible printed circuit.

In the present invention, for example, the stiffness reinforcement is formed in the process for forming the pads on the flexible printed circuit, and the stiffness reinforcement has the same thickness as the pad.

In addition, the present invention provides an ultrasonic transmitter-receiver system comprising the aforementioned ultrasonic probe. The ultrasonic transmitter-receiver system may be an ultrasonic diagnostic system or an ultrasonic sensor, for example.

According to the present invention, the stiffness reinforcement increases the stiffness of the area of the flexible printed circuit, the area being associated with the non-bump area of the chip. Therefore, warping upon press fitting of the bump is prevented and all the bumps are press-fitted into the via holes, with even pressure applied, achieving the ultrasonic probe without unnecessary protrusions on a contact surface between the probe and a subject. In other words, the present invention provides the ultrasonic probe mechanically and electrically reliable.

BRIEF DESCRIPTION OF THE DRAWINGS

FIG. 18A illustrates the ultrasonic probe of the first embodiment and FIG. 18B illustrates the ultrasonic probe of the sixth embodiment;

FIG. 19A is a cross sectional view passing through the reinforcement, and FIG. 19B is a top view thereof;

DETAILED DESCRIPTION OF THE PREFERRED EMBODIMENTS

Embodiments of Ultrasonic Probe

Figure 1:
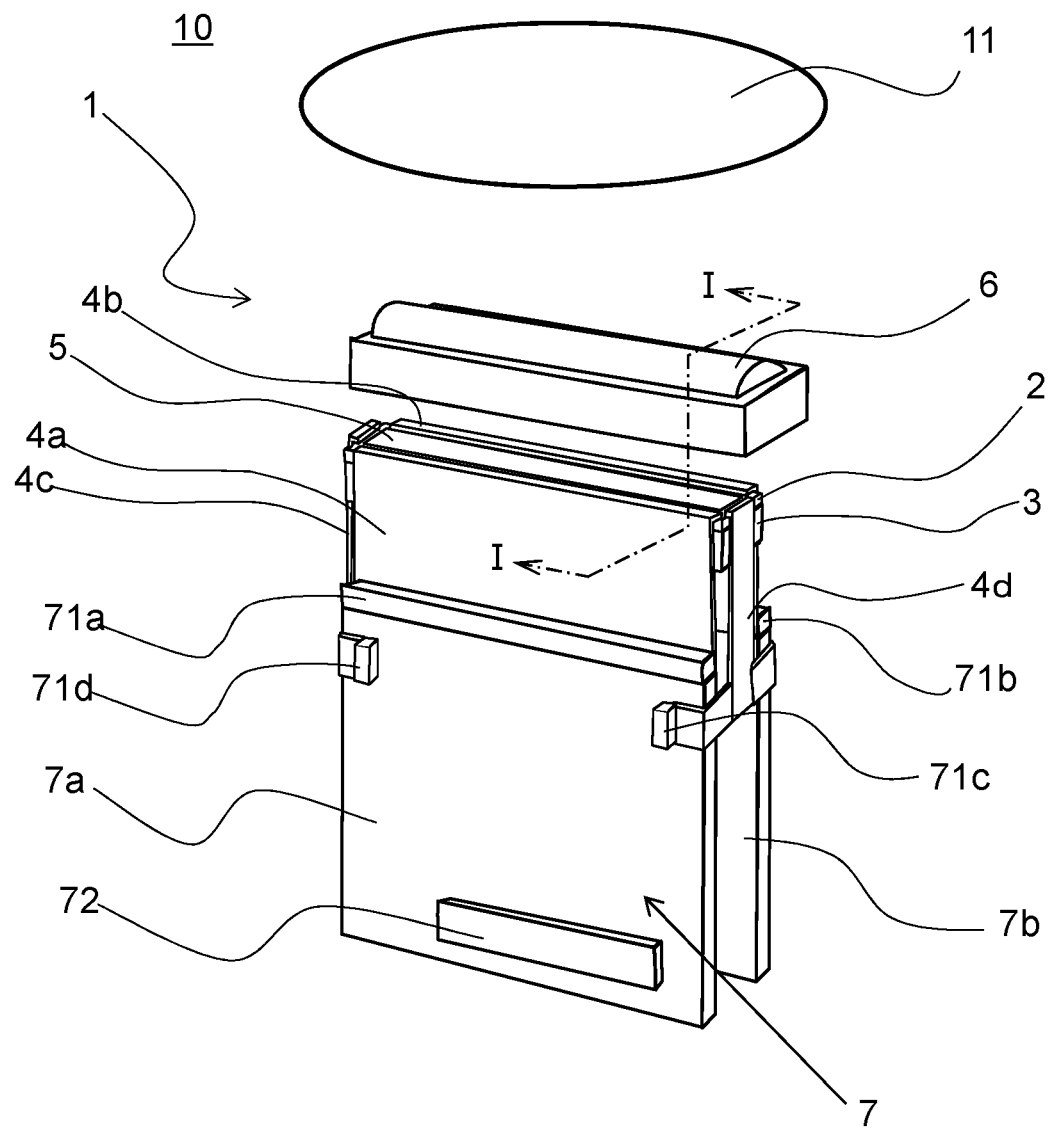
FIG. 1 is an exploded perspective view showing an example of an ultrasonic probe to which the present invention is applied.

There will now be described an ultrasound probe according to embodiments of the present invention. The ultrasonic probe of the present embodiment comprises, as a basic configuration, a chip having a plurality of ultrasonic elements and a plurality of connecting terminals respectively connected to these ultrasonic elements, and a flexible printed circuit (hereinafter, referred to as FPC) provided with an opening for exposing the plurality of ultrasonic elements, and pads along the opening, respectively associated with the plurality of connecting terminals. The ultrasonic probe may further comprise a backing material fixed below the FPC, and an acoustic lens covering the ultrasonic elements on the chip.

In the embodiments described below, there will be described the case where the ultrasonic element is a CMUT element. However, the ultrasonic element in the present invention is not limited to the CMUT element, and any type of element may be usable as far as it is capable of transmitting and/or receiving ultrasonic waves. In the following embodiments, components identical to or corresponding to the constitutional components of the aforementioned ultrasonic probe 10 are represented by the same reference numeral, and when distinctions are to be made among the identical components, alphabets are attached to the end of the reference numerals.

Initially, with reference to FIG. 1, an overall structure of the ultrasonic probe will be described. FIG. 1 illustrates an embodiment of the ultrasonic probe to which the present invention is applied. This ultrasonic probe 10 is used for an ultrasonic diagnostic system, and the ultrasonic probe 10 is provided with the followings, listed in the order starting from the side with which the subject 11 is brought into contact; an acoustic lens 6, a CMUT chip (hereinafter, simply referred to as "chip") 2 equipped with ultrasonic elements (CMUT elements) 5, an FPC 4 (4a to 4d) connecting the chip 2 with external wiring (not illustrated), a backing material 3 fixed on the back side of the chip 2, and a circuit board 7 (7a and 7b) to which connecting terminals of the FPC 4 are connected.

Figure 2:
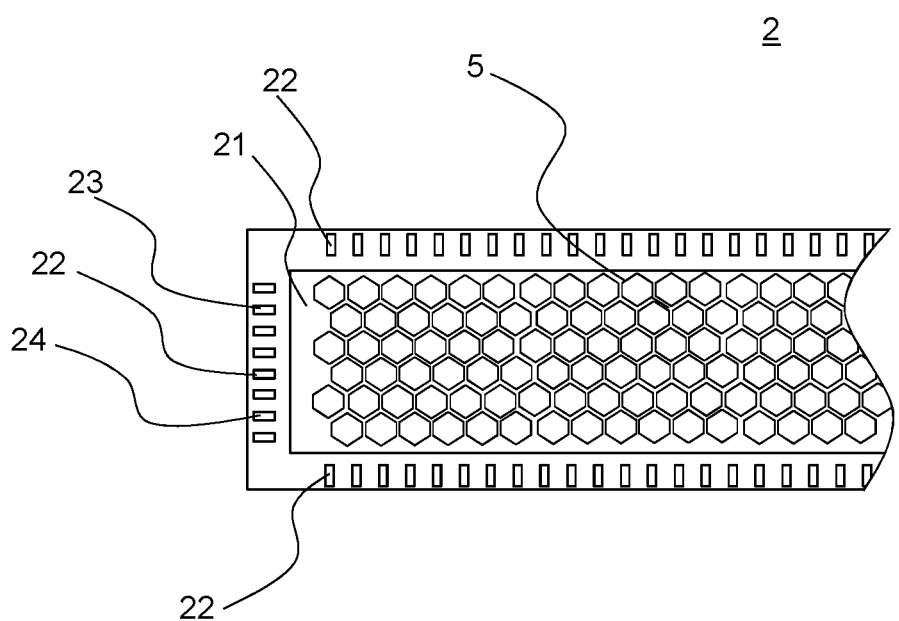
FIG. 2 is a top view of a CMUT (Capacitive Micromachined Ultrasonic Transducer) chip.

The CMUT chip is an ultrasonic transceiver device fabricated with laminated thin films by applying a semiconductor manufacturing technology and MEMS (Micto Electro Mechanical Systems) technology. As shown in FIG. 2, there is formed an element unit 21 comprising a plurality of CMUT elements 5 on a board made of inorganic materials such as silicon, and in the area surrounding the element unit 21, there are formed electrode pads (connecting terminals) 22 respectively connected to the CMUT elements 5, and signal lines (not illustrated) connecting the electrode pads with the CMUT elements 5. In the example as illustrated, the CMUT chip 2 has a rectangular shape when viewed from the top, and the electrode pads 22 are formed along the four sides thereof. The electrode pads 22 may include a ground pad 23 connected to a ground line and a spare pad (extra pad) 24. Positions of the ground pad 23 and the extra pad 24 are not limited to those as illustrated.

A bump (not illustrated in FIG. 2) for bonding the chip to the FPC 4 according to the bump press-fitting method is formed on each of the electrode pads 22. A material of the bump may be copper, gold, or aluminum, and the bump can be formed according to a stud bumping function of a wire bonder. Alternatively, plating may also form the bump.

The backing material 3 is provided to attenuate and absorb unnecessary ultrasonic waves emitted backward from the CMUT elements 5. For example, the backing material may be made of high acoustic impedance materials, including epoxy resin where a substance such as inorganic or organic filler is dispersed.

Figure 3:
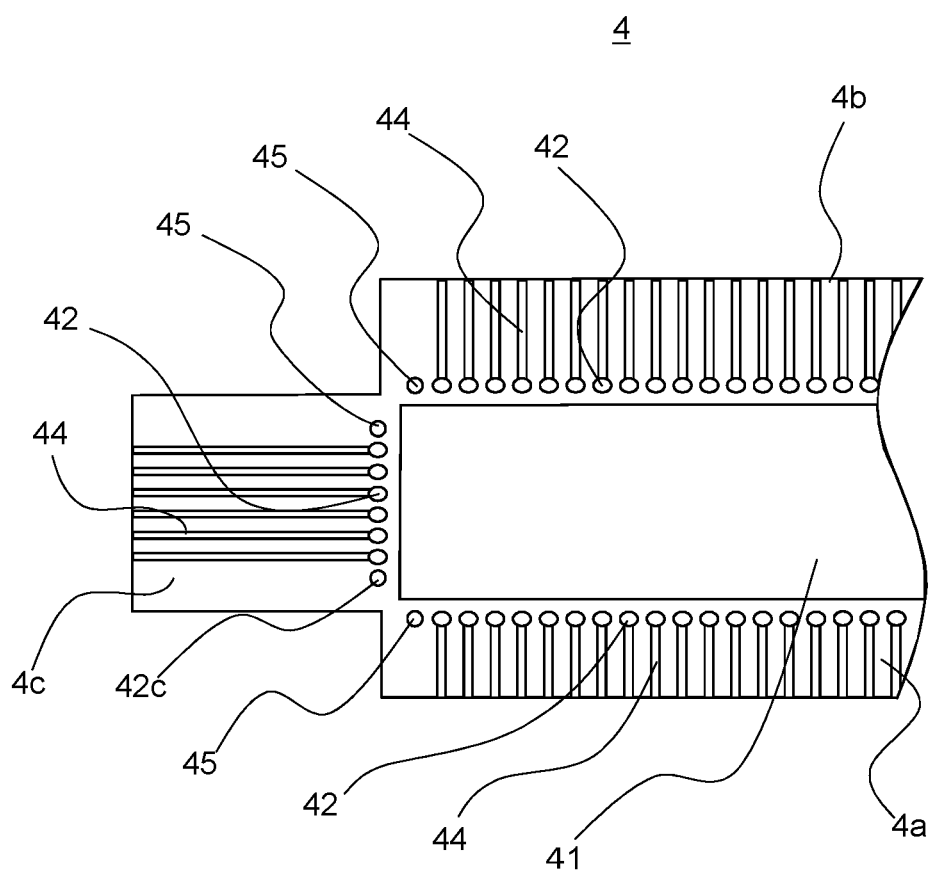
FIG. 3 is a top view of a flexible printed circuit (FPC)

The FPC 4 is an electrical circuit formed of conductive films such as copper film on a base material of insulating resin (e.g., polyimide). As shown in FIG. 3, the FPC 4 is provided with the opening 41 for exposing the element unit 21 on the chip 2, and the FPC 4 comprises bands 4a to 4d extending in four ways in a manner that surrounds the opening 41. On each of the bands, a plurality of pads 42 are formed respectively associated with the electrode pads 22 on the chip 2. A signal line 44 is drawn out from the pad 42, and a wiring for ground (hereinafter, referred to as ground line) is formed on the outside, being the opposite surface of the signal line 44.

Figure 4:
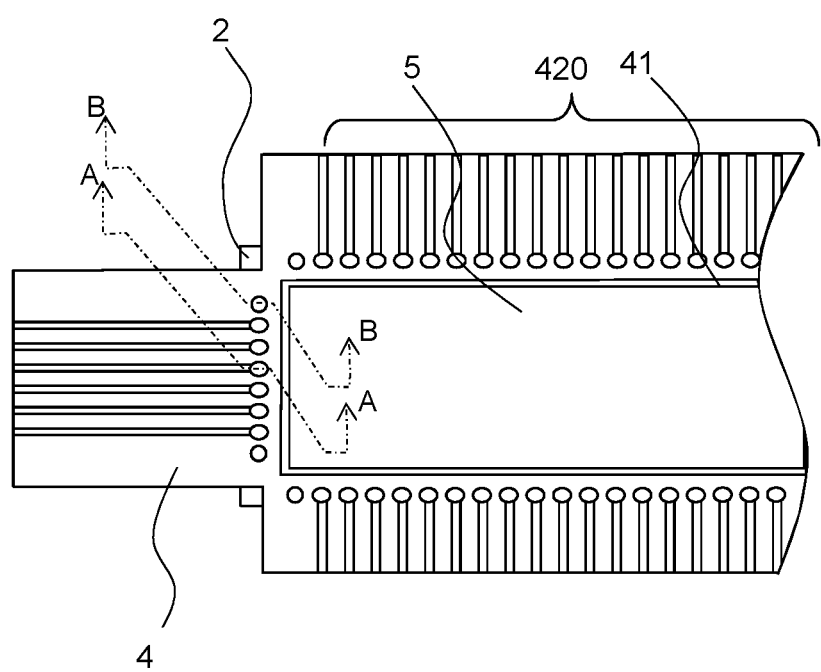
FIG. 4 is a top view when the CMUT chip of FIG. 2 is bonded to the FPC of FIG. 3.

FIG. 4 is a top view of the assembly where the FPC 4 is bonded to the chip 2. In FIG. 4, each pad 42 of the FPC 4 forms a row of pads 420. As shown in FIG. 4, the pads 42 of the FPC 4 are superimposed respectively on the corresponding electrode pads 22 on the chip 2, and the chip 2 is bonded to the FPC 4, in the state where the element unit 21 is exposed from the opening 41 of the FPC 4.

Figure 5A:
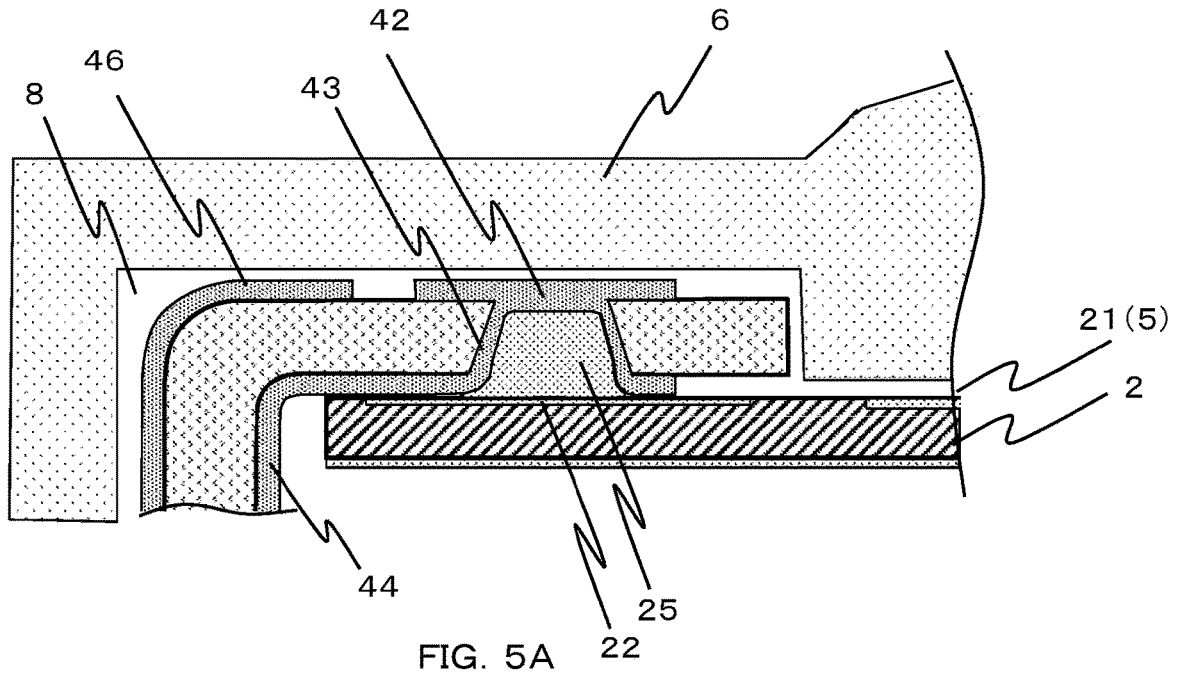
FIG. 5A is a cross sectional view taken along line A-A of a principal part of the ultrasonic probe shown in FIG. 4.

FIG. 5A shows a partial cross section passing through the pad 42 of FIG. 4. The acoustic lens 6 is also shown in this figure. As shown in FIG. 5A, a via hole 43 is formed in the pad 42 of the FPC 4, and the aforementioned bump 25 formed on the electrode pad 22 of the chip 2 fits into the via hole 43. By press-fitting the bump 25 into the via hole 43 allows mechanical and electrical connection between the chip 2 and the FPC 4. In other words, when the bump 25 fits into the via hole 43, the bump 25 is plastically deformed, and caulked by deforming stress, thereby achieving mechanical bonding. In addition, when the surface of the bump 25 slides on the surface of the via hole 43 and a thin surface oxidized layer is scraped, the bump 25 directly comes into contact with the via hole 43. Since direct metal-to-metal contact occurs on the interface therebetween, reducing electrical resistance and electrical connection can be established. Further on the FPC 4, the signal line 44 is drawn out at the pad 42 from the via hole 43 formed on the FPC 4, and the ground line 46 is formed on the outside, being the opposite side of the signal line 44.

In the areas of the FPC 4, where each of the bands 4a to 4d are joined, that is, in the areas in proximity to the four corners of the opening 41, there is provided stiffness reinforcement 45 that increases stiffness of the FPC 4. The stiffness reinforcement 45 thus provided allows application of even pressure to the FPC 4, when the bumps formed on the electrode pads 22 of the chip 2 are press-fitted into the via holes of the pads 42 of the FPC 4, and prevents the corners of the FPC 4 from being warped or deformed due to the pressure, though no pads 42 are provided on the corners. The stiffness reinforcement will be described specifically later.

The acoustic lens 6 is made of materials such a silicone rubber, having a function of lens to bring the ultrasonic waves generated from the CMUT chip 2 into focus. In FIGS. 3 and 4, the bands 4a, 4b, 4c, and 4d of the FPC 4 are provided on the same plane, and they are bent along the shape of the backing material 3 placed on the backside of the CMUT chip 2 (FIG. 1). In this state, the acoustic lens 6 is provided in a manner that covers the CMUT chip 2 and the FPC 4, and bonded via an adhesive agent 8 such as silicone resin.

There are formed on a circuit board 7, connectors 71a, 71b, 71c, and 71d that are connected with the bands 4a, 4b, 4c, and 4d of the FPC 4, and a connecting terminal 72 that establishes connection with an ultrasonic transmitter-receiver system, for example, an ultrasonic diagnostic system with which the ultrasonic probe 10 is connected. The connecting terminal 72 is connected to a main unit through a cable or a similar means not illustrated.

The ultrasonic probe 10 with the aforementioned configuration may operate as the following, for example. First, electrical signals are given to the CMUT chip 2 through the connecting terminal 72, and a diaphragm (not illustrated) provided for the ultrasonic elements 5 is vibrated. Then, the ultrasonic waves generated from the CMUT chip 2 are brought into focus by the acoustic lens 6, and the examinee (subject 11) is irradiated with the ultrasonic waves. The CMUT chip 2 receives the ultrasonic waves reflected from the examinee. The diaphragm for the ultrasonic elements 5 transforms the ultrasonic waves (vibration) into electrical signals, transmits the signals in the form of ultrasonic signals to the main unit where the ultrasonic signals are subjected to processing such as creation of an image. In order to obtain a preferable ultrasonic image, it is important that the operations of the ultrasonic elements 5 are highly reliable. The ultrasonic probe of the present embodiment adds a particular feature to the bonding part between the CMUT chip 2 and the FPC 4, and this strengthens the mechanical and electrical connection, thereby enhancing reliable operations of the chip 2.

There will now be described in detail embodiments of a structure of the assembly comprising the CMUT chip 2 and the FPC 4, being the features of the ultrasonic probe according to the embodiments of the present invention.

First Embodiment

The ultrasonic probe 10A of the present embodiment is provided with a reinforcing pad 45, serving as the stiffness reinforcement of the FPC 4, the reinforcing pad having a shape (a form viewed from the top and a thickness) similar to the pad 42. The pad 42 is provided with a via hole, whereas the reinforcing pad 45 does not aim at electrical connection with the CMUT chip 2. Therefore, it can be referred to as a dummy pad, and the via hole to be engaged with the bump is not required.

Figure 5B:
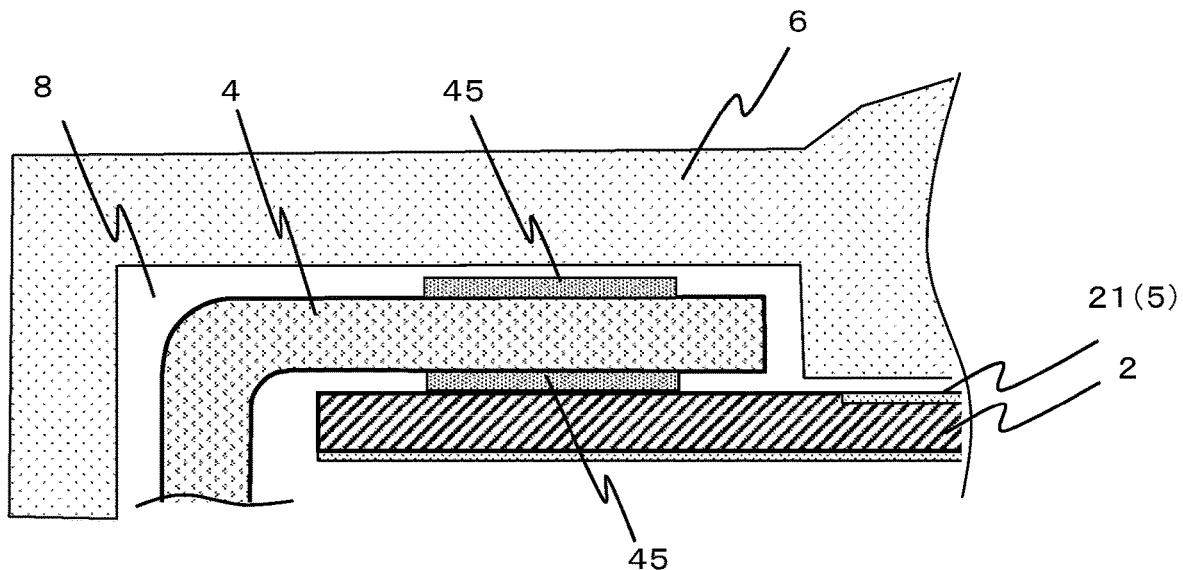
FIG. 5B is a cross sectional view taken along line B-B thereof.

With reference to FIG. 4 and FIG. 5B, there will now be described in detail, a structure of the ultrasonic probe 10A according to the present embodiment. FIG. 5B is a cross sectional view taken along line B-B passing through the reinforcing pad 45 of the assembly as shown in FIG. 4.

As shown in FIG. 4, in the ultrasonic probe 10 of the present embodiment, there are formed reinforcing pads 45 each having the same shape as the pad 42, when viewed from the top, on the ends of the row (rows of pads) 420 comprising a plurality of pads 42 that are arranged along each of four sides of the opening 41 of the FPC 4. As shown in FIG. 5B, the reinforcing pads 45 are placed preferably on both surfaces of the board of the FPC 4. Those reinforcing pads 45 may be formed simultaneously with forming the pads 42 and the signal line 44 as shown in FIG. 5A, and the reinforcing pad 45 may have the same thickness as the pad 42. For example, it is preferable that the thickness of the pad 42 and the reinforcing pad 45 be from 2 to 15 µm. Unlike the pad 42 as shown in FIG. 5A, the reinforcing pad 45 is not provided with lead wiring such as the signal line and the ground line.

The ultrasonic probe 10A can be fabricated according to the bump press-fitting method, except that the FPC 4 is provided with the reinforcement patterns by pattern-forming, each having the same shape as the pad 42, in the areas on the four corners where no pad 42 is formed in proximity to the opening 41. For example, the backing material 3 is adhered to the back surface of the CMUT chip 2, forming one unit, and then, the FPC 4 is bonded to the CMUT chip 2 according to the bump press-fitting method. Next, the adhesive agent is applied to the top of the CMUT chip 2, and the acoustic lens 6 is placed in a manner that covers the CMUT chip 2 and the FPC 4. Then, pressure is applied thereto. The reinforcing pads 45 have the effect of preventing bad connection between the bump 25 and the via hole 43 due to warped or deformed portions where no pads 42 are provided, when pressure is applied to the FPC 4 in the process of bonding the FPC 4 to the CMUT chip 2. Then, this allows enhancement of reliability in mechanical and electrical connection.

The reinforcing pads may be placed in proximity to all the ends of each row of pads. Alternatively, depending on the distance between the end of the pad array direction and the end of the row of pads, one of the reinforcing pads in the area between neighboring FPC parts may not be necessarily provided.

Modifications of First Embodiment

Modification 1

Figure 6:
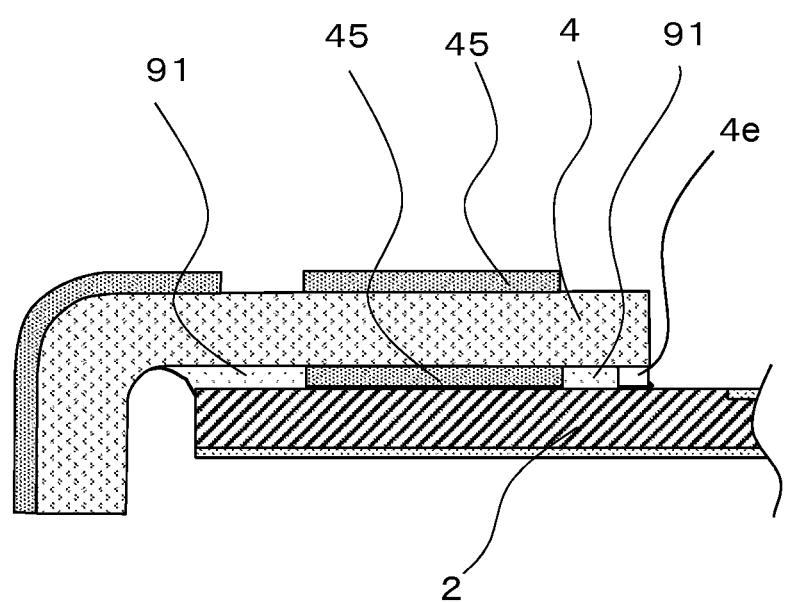
FIG. 6 is a cross sectional view showing Modification 1 of a bonding part between chip and FPC according to the first embodiment.

According to the embodiment as shown in FIG. 4, there has been described the case where the reinforcing pads on the top surface and undersurface of the FPC 4 have the same shape. The size of the reinforcing pad on the top surface may be different from that on the undersurface, or an additional reinforcing means may be provided on the underside. FIG. 6 illustrates an example of this modification.

FIG. 6 is a schematic partial cross section of a bonding part between the FPC 4 and the CMUT chip 2 of the modification 1. In FIG. 6, the acoustic lens 6 is not shown. In the present modification, an underfill 91 is charged between the FPC 4 and the CMUT chip 2, serving as the additional reinforcing means. For example, thermosetting liquid resin made of epoxy resin kneaded with fine particles, is filled between the FPC 4 and the CMUT chip 2 when an assembly of the FPC and the CMUT is fabricated, followed by curing, and then, the underfill 91 is formed. On the undersurface of the FPC 4, there is formed a protrusion 4e, so as to prevent the liquid-type underfill 91 from wet-spreading and reaching the ultrasonic elements 5. Forming this protrusion 4e prevents the underfill 91 from having such an impact on ultrasonic waves generated from the ultrasonic elements 5, that lowers characteristics in transmitting and receiving the ultrasonic waves, and eventually deteriorates diagnostic images.

The underfill 91 is effective in fixing the FPC parts where no reinforcing pad 45 is placed. Thus, even when the FPC 4 is bent after bonded to the CMUT chip 2, reliability in bonding can be enhanced without deforming or warping the FPC 4.

According to the present modified example, the underfill 91 is provided as an additional reinforcing means, and this allows more rigid fixation between the FPC 4 and the CMUT chip 2, in addition to the mechanical bonding by fitting the bump into via hole. This underfill may further enhance insulating property.

Modification 2

Figure 7:
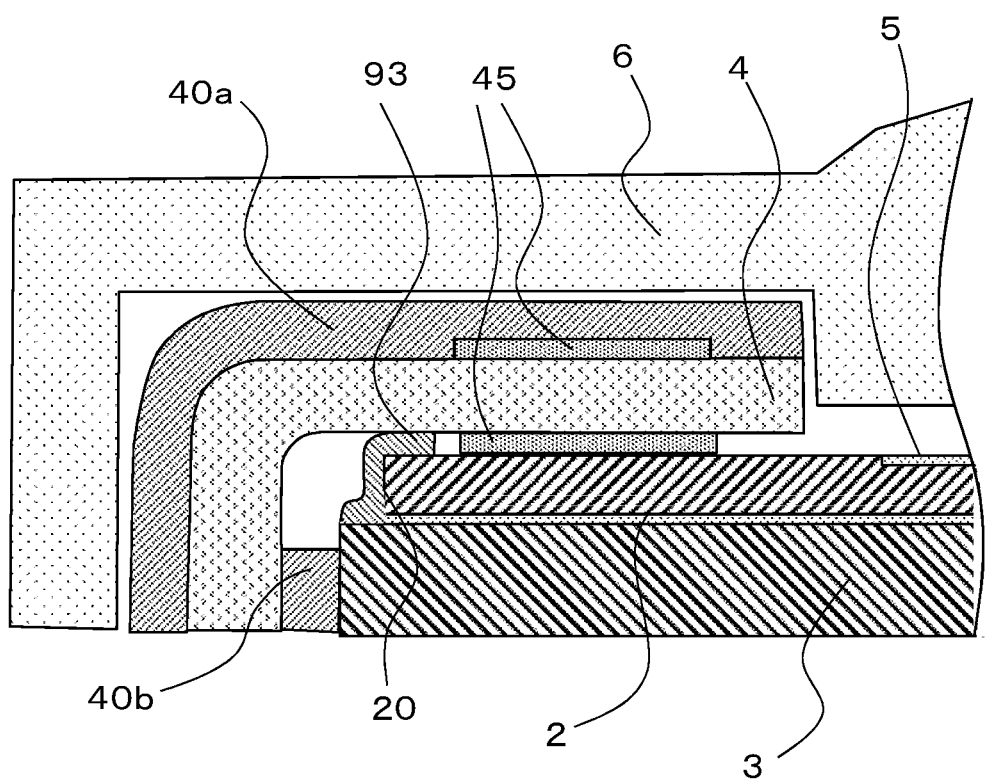
FIG. 7 is a cross sectional view showing Modification 2 of the bonding part between chip and FPC according to the first embodiment.

FIG. 7 shows another modification (modification 2) of the present embodiment. FIG. 7 illustrates a partial schematic cross section of the bonding part between the FPC 4 and the CMUT chip 2 according to the present modification 2. FIG. 7 shows the FPC 4 where coverlays 40a and 40b are formed, respectively on the top surface and the undersurface in order to protect the surfaces of the FPC.

In modification 2, an insulating layer 93 is formed on the corner of the end zone of the CMUT chip 2, in a manner that covers the surface of the CMUT chip 2; the side surface 20 and the surface where the ultrasonic elements 5 are formed. This insulating layer 93 allows insulation of the side surface 20 where silicon being a base material of the CMUT chip 2 is exposed. In addition, this insulation facilitates prevention of electrical shootings due to migration or other reasons, enabling increase of drive voltage of the CMUT with increasing ultrasonic power, and this contributes to an improvement in image quality. The insulating layer 93 is also provided on the surface where the ultrasonic elements 5 are formed, and this is effective in preventing warping and deforming of the FPC 4, in the process of bonding the FPC 4 and the CMUT chip 2.

Further in the present modification, the coverlay 40 allows reduction of exposure of the surface of pads and wiring, for example, metallic portions including Cu, Ni, and Au, and then preventing corrosion. The coverlay 40b on the underside is formed up to the side of the backing material 3, and there is no coverlay on the bending point of the FPC 4. This configuration allows reduction of the degree of resistance to bending of the FPC 4.

Modification 3

In the present modification, the reinforcing pad 45 of the first embodiment is made to have the same structure as the pad 42 that is connected to the signal line.

Figure 8:
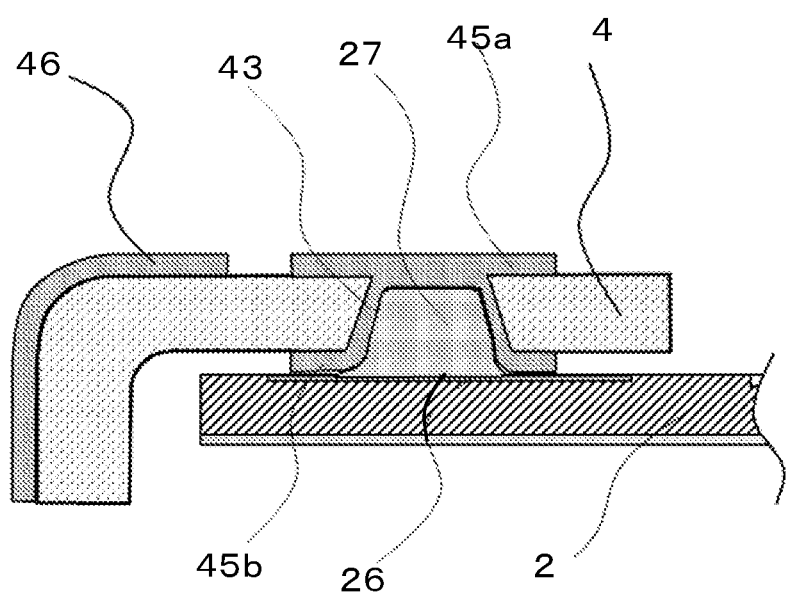
FIG. 8 is a cross sectional view showing Modification 3 of the bonding part between chip and FPC according to the first embodiment.

FIG. 8 is a schematic partial cross section of the bonding part between the FPC 4 and the CMUT chip 2 according to the present modification. In the present modification, a dummy pad 26, being independent and not electrically connected with the ultrasonic element, is formed in the area at the corner where the electrode pad 22 of the CMUT chip 2 is not formed. On the dummy pad 26, a bump 27 is formed, which is similar to the bump 25 formed on the electrode pad 22.

On the other hand, a corresponding area of the FPC 4 is provided with the reinforcement 45 having a structure similar to the pad 42 as shown in FIG. 5A. In other words, the reinforcing pads 45a and 45b are provided, having the same shape as the pad 42, respectively on the top surface and the undersurface of the FPC 4, and the via hole 43 that establishes communication between the reinforcing pads 45a and 45b is also formed. The bump 27 fits into the via hole 43, thereby bonding the FPC 4 to the CMUT chip 2.

According to the present modification, the reinforcement 45 contributes to increasing of the bonding strength, in addition to the effect of reinforcing the corner rigidity of the FPC 4. In FIG. 8, the ground line 46 is formed on the top surface of the FPC 4, but this ground line 46 may not be necessarily provided. In addition, the reinforcing pad 45a on the top surface may be communicated with the ground line 46.

Second Embodiment

In the ultrasonic probe 10A of the first embodiment, the reinforcing pad 45 having the same shape as the pad 42 is provided as the stiffness reinforcement of the FPC 4. In the present embodiment, the ultrasonic probe 10B features that the stiffness reinforcement of the FPC 4 has a shape similar to the shape of the area where no pad 42 is provided.

Figure 9:
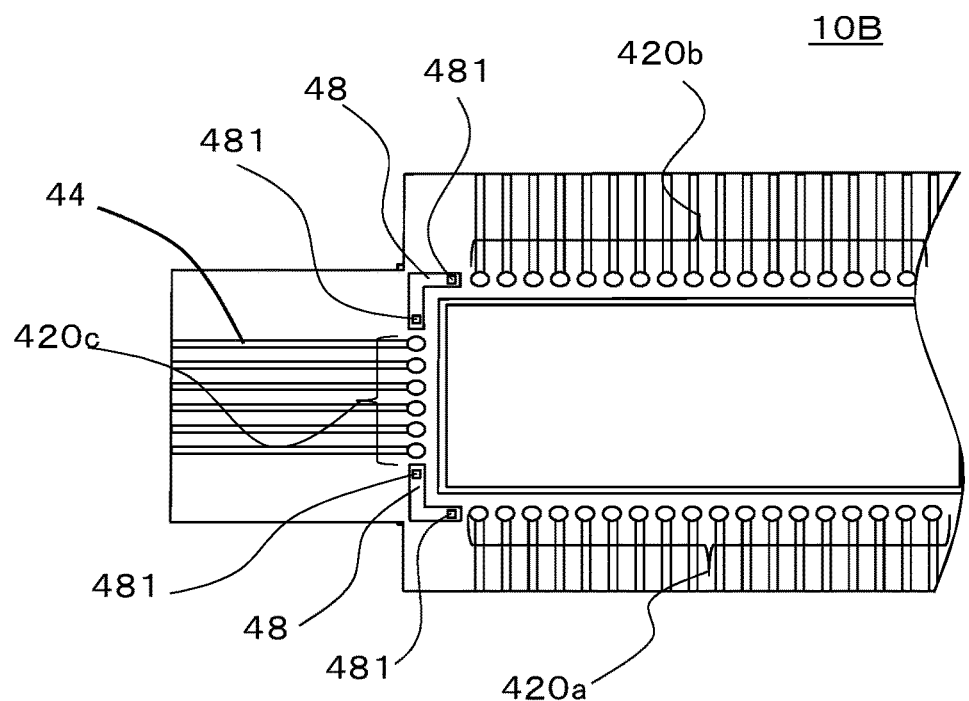
FIG. 9 is a top view of the ultrasonic probe according to a second embodiment.

FIG. 9 is a partial schematic view of the top surface of the FPC 4 according to the present embodiment. The FPC 4 has the same configuration as the first embodiment except the stiffness reinforcement, comprising the opening 41, the rows of pads 420a, 420b, 420c, and 420d (not illustrated), including a plurality of pads 42 arranged along the sides of the opening, and the signal line 44 drawn out from each pad 42 and the ground line. An L-shaped reinforcement 48 is formed on the corner between the rows of pads. The reinforcement 48 with this type of shape may also be fabricated in the same process as the pad 42, as in the case of the reinforcing pad 45 of the first embodiment, and the reinforcement 48 has the same thickness as the pad 42.

In the present embodiment, the reinforcement 48 has the L-shape, and this reinforces the corner of the opening 41 entirely. Therefore, warping and deforming of the FPC 4B upon bonded to the CMUT chip 2 can be reduced, relative to the FPC of the first embodiment where the reinforcement each having the pad-like shape is provided.

On the FPC 4 of the present embodiment, an opening 481 for alignment is formed on the reinforcement 48. In the case where the CMUT chip 2 used in this example is provided with a mark (not illustrated) for aligning the electrode pads 22 on the chip side with the pads 42 on the FPC side, this mark of the CMUT chip 2 is visible from the top of the FPC 4 through the opening 481. This configuration allows accurate alignment between the FPC 4 and the CMUT chip 2, improving reliability of bonding between the bump and pad.

Figure 10:
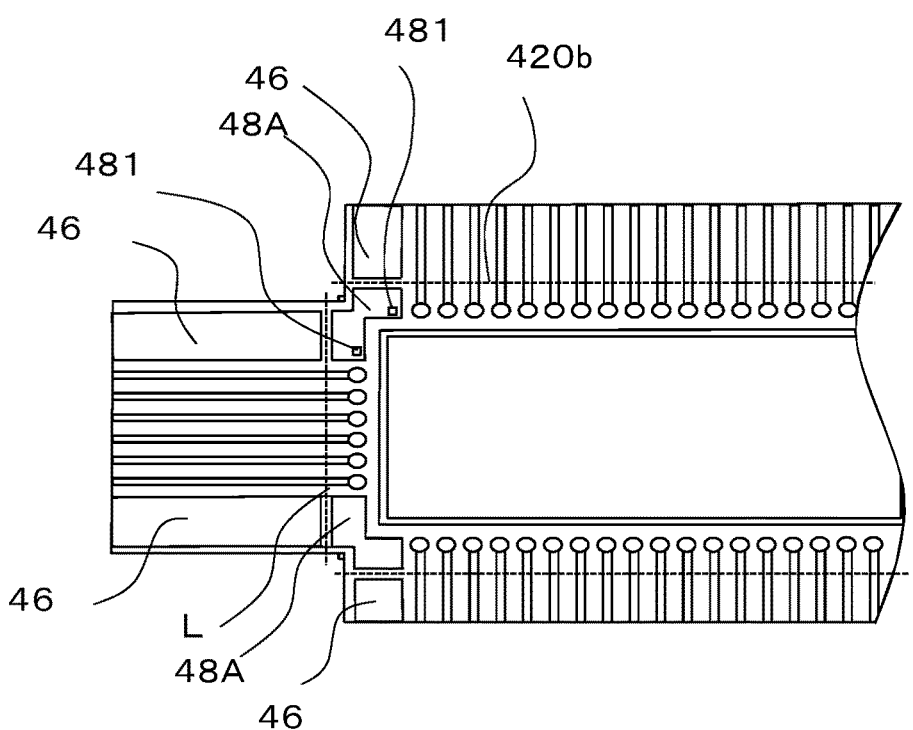
FIG. 10 is a top view of a modification of the second embodiment.

In FIG. 9, the reinforcement 48 is L-shaped having the same width as the rows of pads 420, but the shape of the reinforcement 48 is not limited to this L-shape. FIG. 10 shows an example of modification showing another shape of the reinforcement 48. FIG. 10 is a partial schematic view of the top surface of the FPC 4, according to the present modification. As illustrated, the reinforcement 48A is enlarged to the bending point (the position of the bend line L) where the FPC 4 is supposed to be bent, from the position at the same distance from the opening 41 as the rows of pads 420. In addition, there is provided the ground line 46 having the width corresponding to the width of the reinforcement 48A (the width along the bend line L). This type of wide ground line 46 being provided allows enhancement of shielding effect. The reinforcement 48A is also provided with the openings 481 for alignment, similar to the aforementioned embodiment.

In the present example of modification, the reinforcement 48A is widened, thereby further improving the rigidity of the FPC 4, and then warping and deforming of the FPC can be reduced when the FPC is bonded to the CMUT chip.

When the FPC 4 is bent along the outline of the backing material (not illustrated), clearance is formed between the reinforcement 48A and the ground line 46 around the bend line L, and thus the degree of resistance to bending can be reduced.

Third Embodiment

In the ultrasonic probe according to the first and the second embodiments, the reinforcing member neither contributes to the signal line nor has an electrical function. The ultrasonic probe 10C of the present embodiment features that the reinforcing member also has functions including a ground.

Figure 11:
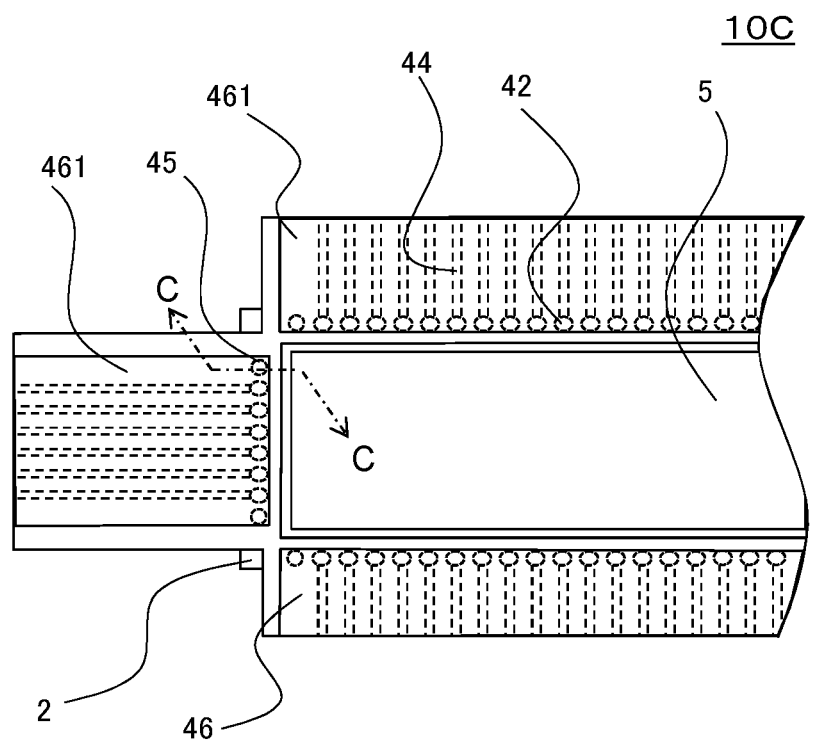
FIG. 11 is a top view of the ultrasonic probe (chip-FPC assembly) according to a third embodiment.
Figure 12:
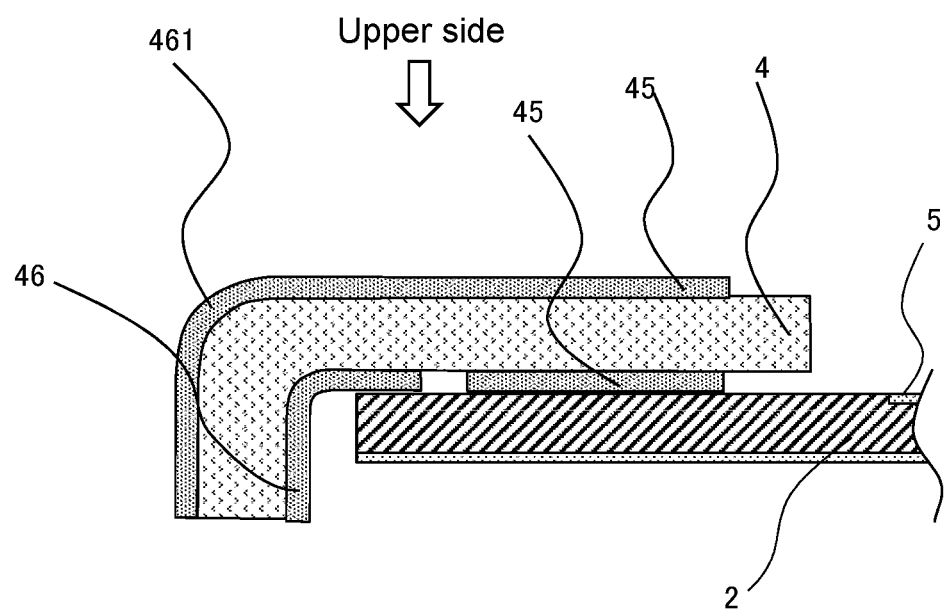
FIG. 12 is a cross sectional view taken along line C-C of FIG. 11.

With reference to FIGS. 11 and 12, there will now be described details of the bonding structure between the FPC and the CMUT chip according to the present embodiment. FIG. 11 is a top view of the assembly comprising the FPC and the CMUT, and FIG. 12 is a cross sectional view taken along line C-C passing through the reinforcing member of the assembly shown in FIG. 11.

As shown in FIG. 12, the configuration of the undersurface of the FPC 4 according to the present embodiment is the same as the first embodiment, and the reinforcing pad 45 is provided at the ends of the row of pads, in line with the pads 42. In addition, the ground line 46 is formed electrically disconnected with the reinforcing pad 45. The ground line 46 is formed in the same process as the reinforcing pad 45, equivalent in thickness, and the ground line 46 has a function that prevents warping and deforming of the FPC 4 as in the case of the reinforcing pad 45.

On the other hand, as shown in FIG. 11, the ground layer 461 is formed on the top surface of the FPC 4 in a manner that covers almost the entire area overlapping the pads 42, the wiring 44 thereof, and the reinforcing pads 45 on the underside, through the FPC board. In other words, the ground layer 461 serves as the ground wiring and it is formed with an enlarged area up to the position of the reinforcing pads 45 on the upper side. This configuration is effective because this allows expansion of the area where a shield effect can be obtained against external radio noise. In addition, the ground layer serves as a reinforcing member that reinforces the rigidity of the FPC 4 together with the structure on the undersurface, preventing the FPC 4 from warped and deformed, as in the case of the reinforcing pad.

According to the present embodiment, the ground wiring itself can be used as a means that reinforces the FPC rigidity, thereby improving the reinforcing effect along with enhancing the shield effect.

Fourth Embodiment

The ultrasonic probe 10D of the present embodiment is the same as the third embodiment in the point that the reinforcing member also has the functions such as the ground. The present embodiment features that the structures similar to a ground pad connected to the ground line and an extra pad connected to spare wiring provided on the FPC, are formed as the reinforcing members. Specifically, the pad for a ground connected to the ground line and the pad for the spare wiring are formed on the ends of the row of pads on the FPC 4, so that they can serve as a part of the reinforcing pad.

Figure 13:
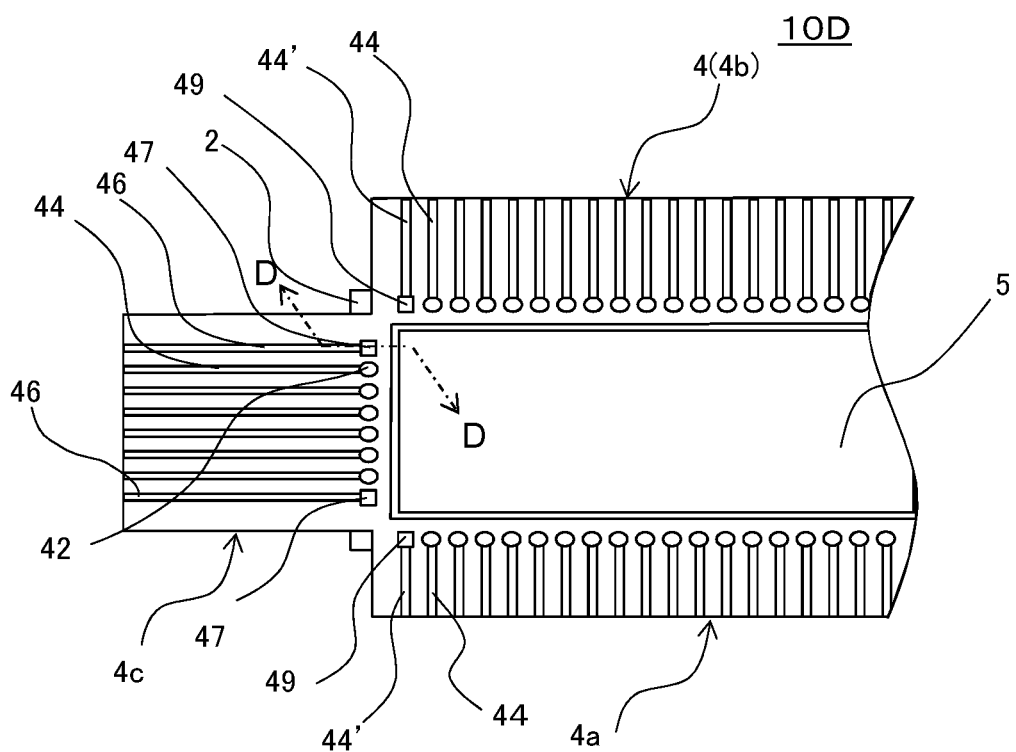
FIG. 13 is a top view of the ultrasonic probe (chip-FPC assembly) according to a fourth embodiment.
Figure 14:
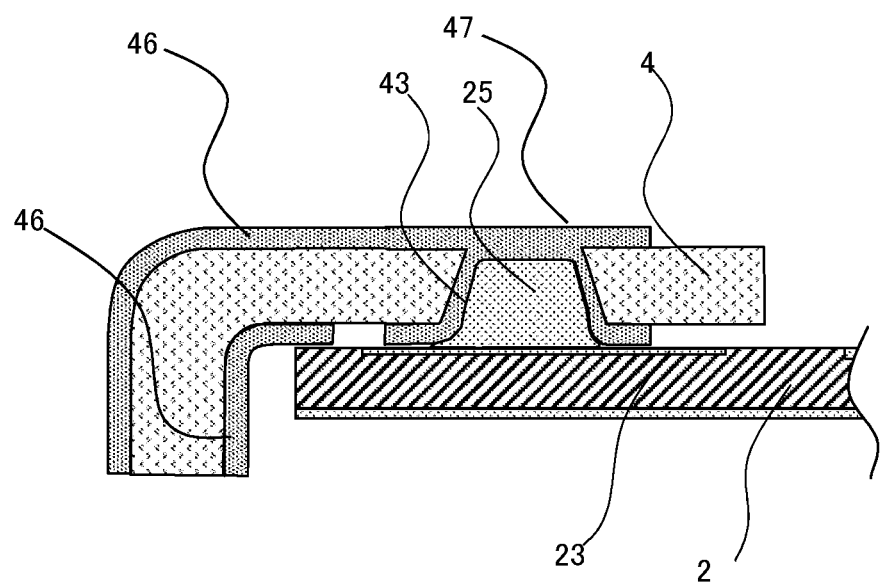
FIG. 14 is a cross sectional view taken along line D-D of FIG. 13.

FIG. 13 is a partial schematic view of the top surface of the assembly according to the present embodiment, and FIG. 14 is a cross sectional view taken along D-D line passing through the pad for the ground. As shown in FIG. 13, on the band 4c of the FPC 4, there are formed the ground line 46 and the ground pad 47 communicating with the ground line 46, outside the end of the row of pads 420. Further as shown in FIG. 14, in the part of the FPC 4 where the ground pad 47 is formed, there is formed the via hole 43, similar to the pad 42 connected to the signal line 44. On the other hand, the bump 25 is formed on the ground pad 23 of the CMUT chip 2, and the bump 25 fits into the via hole 43 formed in the ground pad 47. The ground line 46 is connected to the ground pad 23 of the CMUT chip 2 via the bump 25.

On the FPC 4, the spare wiring 44' and the extra pads 49 connected thereto are formed in the bands 4a and 4b, respectively, being adjacent to the band 4c where the ground pads 47 are formed. The structure of the extra pad 49 is the same as the ground pad 47 as shown in FIG. 14, except that the ground line 46 serves as the signal line, and the bump of the extra pad 24 formed on the CMUT chip 2 fits into the via hole being formed.

In the present embodiment, each of the areas on the FPC 4, the area connecting the bands 4a and 4c, and the area connecting the bands 4b and 4c, is reinforced by the reinforcement comprising the ground pad 47 and the extra pad 49. With this configuration, similar to the first embodiment, warping and deforming of the corners of the FPC 4 upon bump press-fitting can be prevented, further preventing bonding failure between the bump 25 and the via hole 43, allowing enhancement of reliability in mechanical and electrical connection.

In the FPC 4 as shown in FIG. 13, in the state where the signal line adjacent to the ground line 46 and the pad adjacent to the ground pad 47 serve as the ground line and the ground pad, respectively, the aforementioned ground line 46 and the ground pad 47 are newly provided on the outer side. Accordingly, this allows the wiring and the pad, which are originally intended to serve as the ground line and the ground pad, to serve as the signal line and the pad connected thereto. Accordingly, this enables increase of the number of channels of the element unit 21. As for the extra pad, similarly, when the extra pad connected to the spare wiring is included in the row of pads 420, the extra pad is made to function as the pad that is connected to the signal line, thereby increasing the number of channels of the element unit 21.

In the example as shown in FIG. 13, the ground pads 47 are formed in the band 4c on the FPC 4, and the extra pads 49 are formed in the bands 4a and 4b adjacent to the band 4c. Any of the structures may be replaced by the reinforcing pad 45 formed on the outside of the row of pads 420, similar to the first embodiment.

In the present embodiment, the ground pad 47 and the extra pad 49 are placed outside the rows of pads 420. When the ground pad connected to the ground line or the extra pad connected to the spare wiring is formed on the end of the row of pads, this ground pad or this extra pad may be used as the reinforcing pad. Then, the reinforcing pad of the present invention may be formed only on the end of the row of pads where neither the ground pad nor the extra pad is formed.

Fifth Embodiment

In the embodiments described so far, there has been described the FPC-chip assembly structure that is employed for the ultrasonic probe having almost quadrilateral shape when viewed from the top, as shown in FIG. 1. The present embodiment relates to an assembly structure, for example, for an endoscope or an ultrasonic probe used by inserting into a body during an operation, and a puncture needle to suck inner body tissue to be examined.

Figure 15:
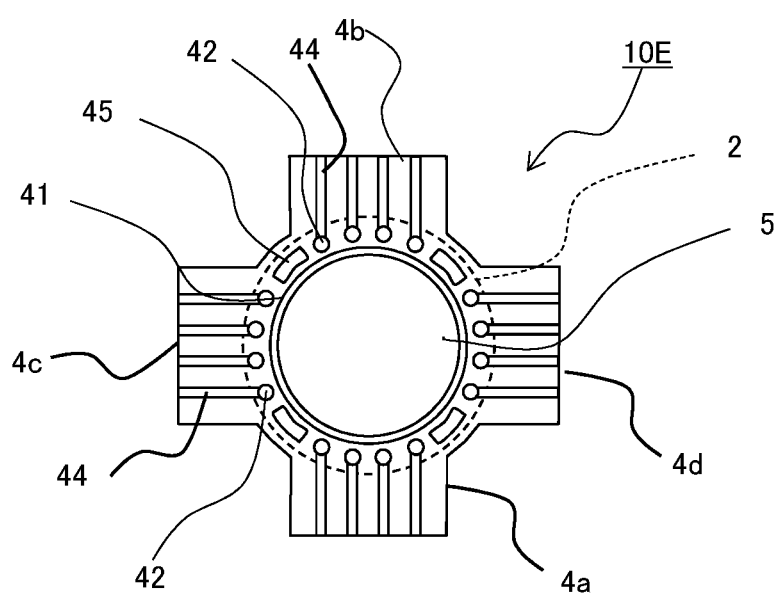
FIG. 15 is a top view of the ultrasonic probe (chip-FPC assembly) according to a fifth embodiment.

With reference to FIG. 15, there will now be described the ultrasonic probe 10E of the present embodiment, focusing on the points different from the first embodiment. FIG. 15 is a schematic top view of an FPC 4 and CMUT chip 2 assembly of the ultrasonic probe according to the present embodiment.

As illustrated, the outline (dotted line) of the CMUT chip 2 of the present embodiment has a circular shape. A circular-shaped opening 41 is provided in the FPC 4, and the element unit (ultrasonic elements 5) having a circular shape for transmitting and receiving ultrasonic waves is arranged under the opening 41. A base of the FPC 4 has an almost circular area along the opening 41, and bands 4a to 4d extending in four directions from this area, and the circular area along the opening 41 is provided with the pads 42 and the reinforcing pads 45. On each of the bands 4a to 4d, there are provided signal lines 44 (including the ground line), each connected the pad 42. The pads 42, the reinforcing pads 45, and the signal lines 44 can be formed simultaneously, forming a wiring pattern on the FPC 4, and they have the same thickness, similar to the other embodiments. The pad 42 has the same structure as the pad shown in FIG. 5A, and the pad 42 is connected to the signal pad (not illustrated) on the CMUT chip 2, or to the ground pad (not illustrated).

The reinforcing pad 45 is provided in the area between the bands where no pad 42 is provided, adjacent to the pads 42. Through not illustrated, similar to the first embodiment, the reinforcing pad 45 is also provided on the undersurface of the FPC 4. In the illustrated example, the reinforcing pad 45 is provided on the area between the bands, having the nearly quadrilateral shape contoured to the shape of the area between the bands, and the reinforcing pad 45 has a function to reinforce stiffness of the area on the FPC.

According to the present embodiment, similar to the first and the second embodiments, the reinforcing pad is provided, thereby preventing the FPC 4 from being warped or deformed by applied pressure when the assembly of the FPC 4 and the CMUT chip 2 is fabricated according to the bump press-fitting method. Thus, the ultrasonic probe with high mechanical and electrical reliability can be provided.

The present embodiment may be combined with a structure according to any of the other embodiments or the modifications thereof. For example, as shown in FIG. 8, there may be considered a structure where the reinforcing pads formed on both the upper and the lower surfaces of the FPC are communicated through the via hole, a bump is formed on the CMUT chip 2 side, and the bump is fitted into the via hole, whereby coupling between the CMUT chip 2 and the FPC 4 can be strengthened, in addition to the reinforcement of the FPC. As shown in FIG. 12, the reinforcing pad may also be connected to the ground line, so as to be used as the ground.

In addition, the form of the CMUT chip 2 is not limited to the circular shape, and any shape may be possible, including an ellipse, an oval, and a polygonal such as hexagon and octagon. The shape of the FPC 4 may vary according to the shape of the CMUT chip 2.

Sixth Embodiment

The aforementioned embodiments from the first to the fifth embodiment are directed to the ultrasonic probe having a structure that the pads formed around the opening of the FPC are bonded from the upper side, to the electrode pads formed on the same plane as the ultrasonic elements of the CMUT chip. The ultrasonic probe 10G of the present embodiment has a structure that uses the CMUT chip with the electrode pads on the opposite side (backside) of the surface where the ultrasonic elements are formed, and the pads of the FPC are bonded from the lower side.

Figure 16:
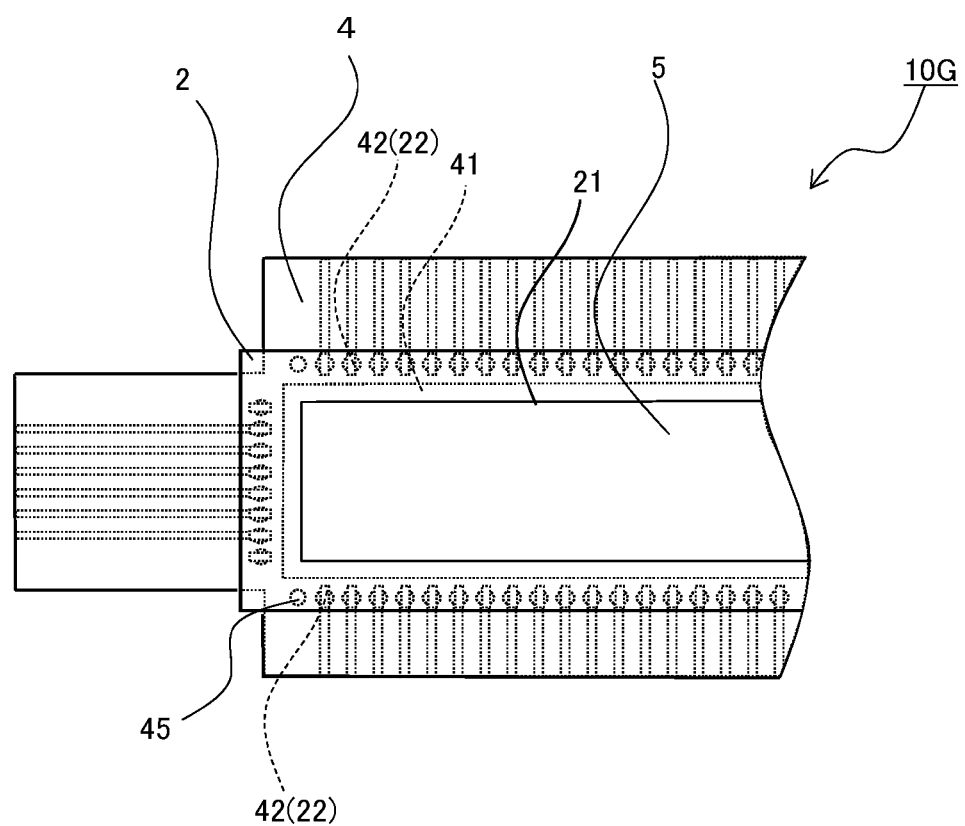
FIG. 16 is a top view of the ultrasonic probe (chip-FPC assembly) according to a sixth embodiment.
Figure 17A:
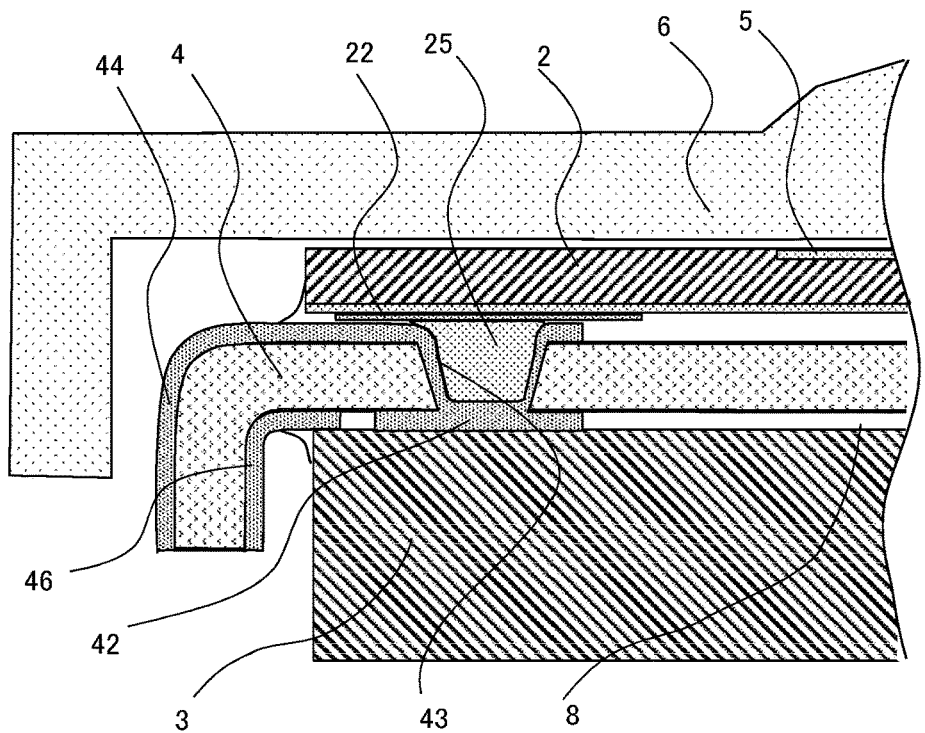
FIG. 17A is a cross sectional view passing through a pad of FIG. 16.
Figure 17B:
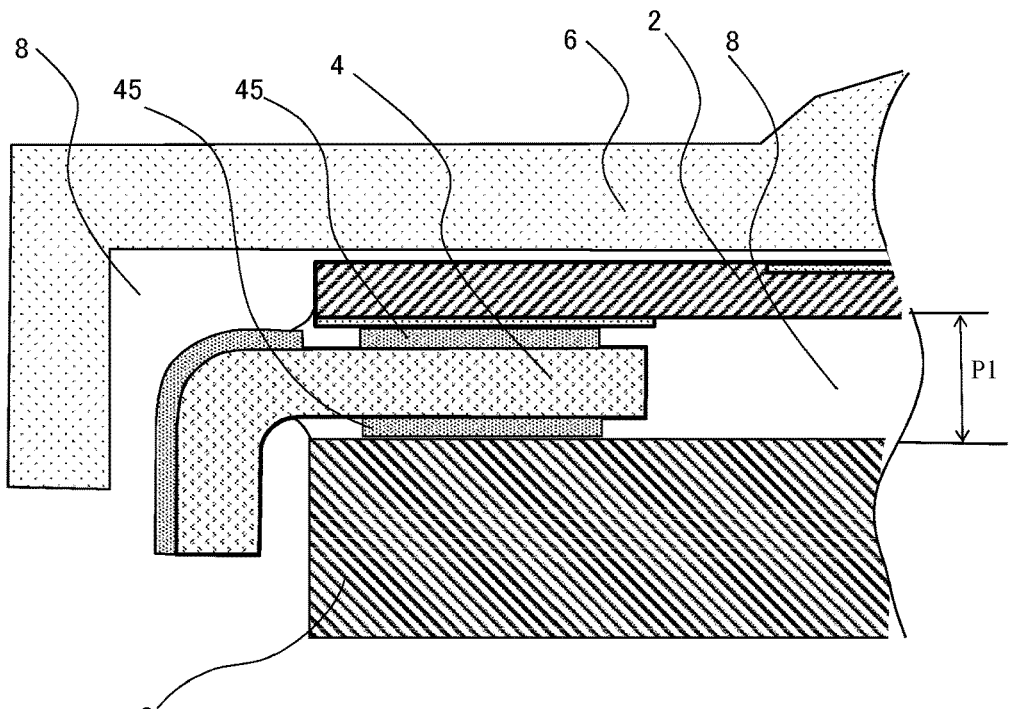
FIG. 17B is a cross sectional view passing through a reinforcing pad of FIG. 16.

With reference to FIGS. 16 and 17, there will now be described the bonding part (assembly) of the FPC 4 and the CMUT chip 2 of the present embodiment. FIG. 16 is a top view of the assembly, FIG. 17A is a partial cross section passing through the pad of the assembly, and FIG. 17B is a partial cross section passing through the reinforcing pad of the assembly. The acoustic lens 6 and the backing material 3 are also illustrated in both figures.

As shown in FIG. 16, on the CMUT chip 2, there is formed the element unit 21 comprising a plurality of ultrasonic elements 5 formed on a board made of materials such as silicone, and on the backside, there are formed a signal line (not shown in FIG. 16) and electrode pads 22, connected to the ultrasonic elements 5, respectively. The ultrasonic elements 5 are connected to the signal lines by wiring or lead lines passing on the side surface of the board. The FPC 4 is placed on the backside of the CMUT chip 2, and FPC 4 has the opening 41 corresponding to the element unit 21 of the CMUT chip 2. The pads 42 respectively connected to the electrode pads 22 are formed along the four sides of the opening 41. In the area of the FPC 4 corresponding to the area of the CMUT chip 2 where no electrode pad 22 is provided, there is formed the reinforcing pad 45 that is not connected to the signal line.

The structure of the electrode pads 22 on the CMUT chip 2 is the same as the electrode pads of the first embodiment as shown in FIG. 5A, except that it is mounted upside down. In addition, the bump 25 is formed on the electrode pad to be bonded to the pad 42 of the FPC 4.

As shown in FIG. 17A, the pad 42 with the via hole is formed on the position of the FPC 4 corresponding to the electrode pad 22 of the CMUT chip 2. The pad 42 is connected to the signal line 44 formed on the top surface of the FPC through the via hole 43. On the backside of the FPC 4, there is formed the ground line 46 that is not connected to the pad 42.

On the other hand, as shown in FIG. 17B, the reinforcing pads 45 are formed on both surfaces of the FPC 4. The reinforcing pad 45 can be formed simultaneously with the pad 42, the signal line 44, and the ground line 46, and the reinforcing pad 45 is not connected to the signal line 44 nor with the ground line. The thickness of the reinforcing pad is the same as the pad 42.

On the undersurface of the FPC 4, the backing material 3 is fixed thereon via the adhesive layer 8. The adhesive layer 8 is also filled in the clearance P1 between the CMUT chip 2 and the backing material 3, and this allows bonding between the ultrasonic elements 5 and the backing material 3.

The acoustic lens 6 is attached to the ultrasonic elements 5 positioned on the top surface of this assembly by an adhesive agent or a similar agent.

In the ultrasonic probe 10G of the present embodiment, the CMUT chip 2 is bonded to the FPC 4 to which the backing material 3 is adhesively fixed, by fitting the bump 25 of each electrode pad 22 on the CMUT chip 2 into the corresponding via hole 43. Then, the reinforcing pad 45 allows prevention of deforming and warping due to application of pressure to the FPC 4, similar to the other embodiments.

In the ultrasonic probe 10G of the present embodiment, the bonding part between the CMUT chip 2 and the FPC 4 is placed on the underside of the CMUT chip 2. This configuration reduces the thickness of the acoustic lens structurally, relative to the ultrasonic probe that has the bonding part on the top surface of the CMUT chip 2.

Figure 18A:
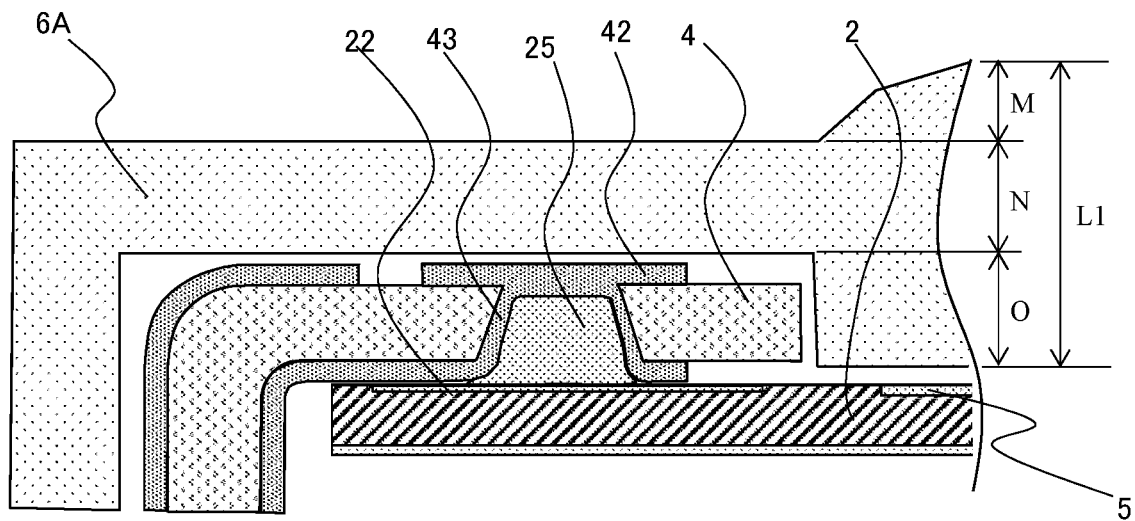
FIGS. 18A and 18B illustrate an effect of the ultrasonic probe according to the sixth embodiment, where
Figure 18B:
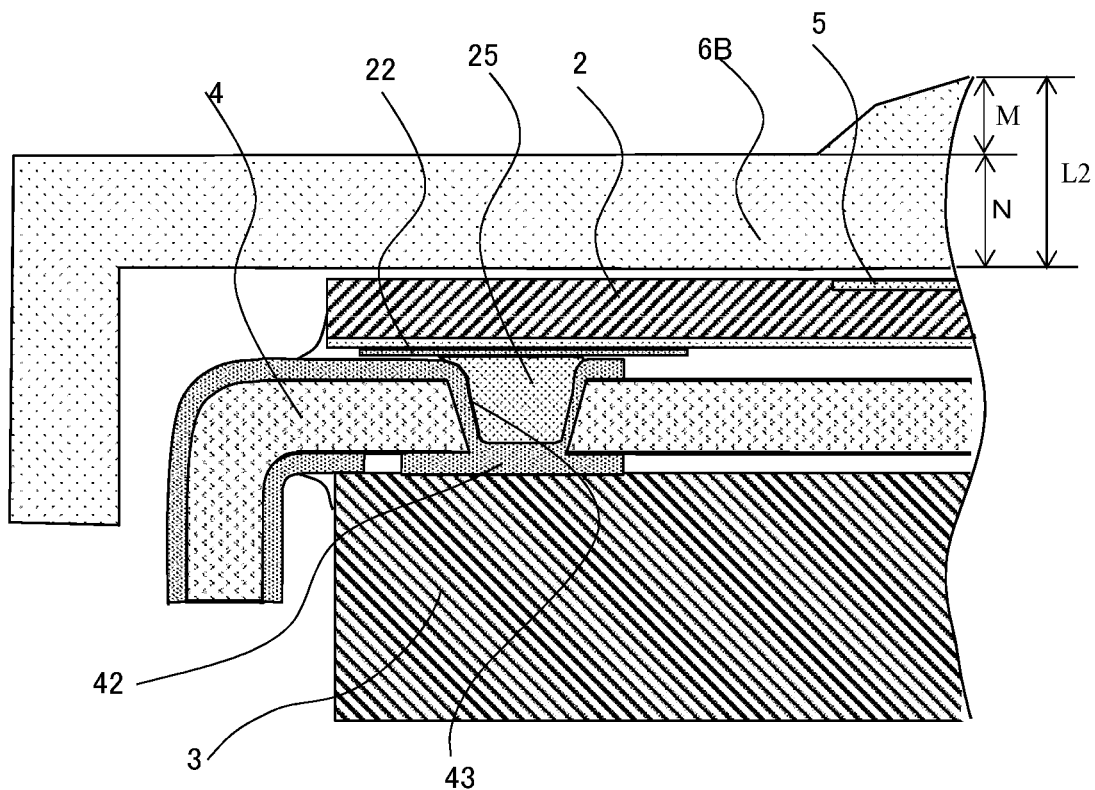

With reference to FIG. 18, this effect will be described in detail. FIG. 18A illustrates a cross section of the assembly shown in FIG. 5A, and FIG. 18B illustrates a cross section of the assembly shown in FIG. 17A. In the assembly shown in FIG. 18A, the maximum thickness of the acoustic lens 6A is equal to L1, totaling the curved portion M of the acoustic lens that performs convergence of ultrasonic waves substantially, the flat portion N of the acoustic lens, and the thickness O necessary for the bonding structure between the CMUT chip and the FPC. On the other hand, in the assembly as shown in FIG. 18B, the thickness O for the bonding part as shown in FIG. 18A becomes unnecessary, and the maximum thickness of the acoustic lens 6B becomes L2, totaling the thickness M of the acoustic lens curved portion and the thickness N of the acoustic lens flat portion. Since the acoustic lens 6B of the present embodiment is thinner than the acoustic lens 6A shown in FIG. 18A, attenuation of ultrasonic waves is lowered within the acoustic lens when the ultrasonic waves pass through the acoustic lens. This inhibits reduction of S/N in transmitting and receiving the ultrasonic waves, thereby enhancing a diagnostic image.

Modification of Sixth Embodiment

Figure 19A:
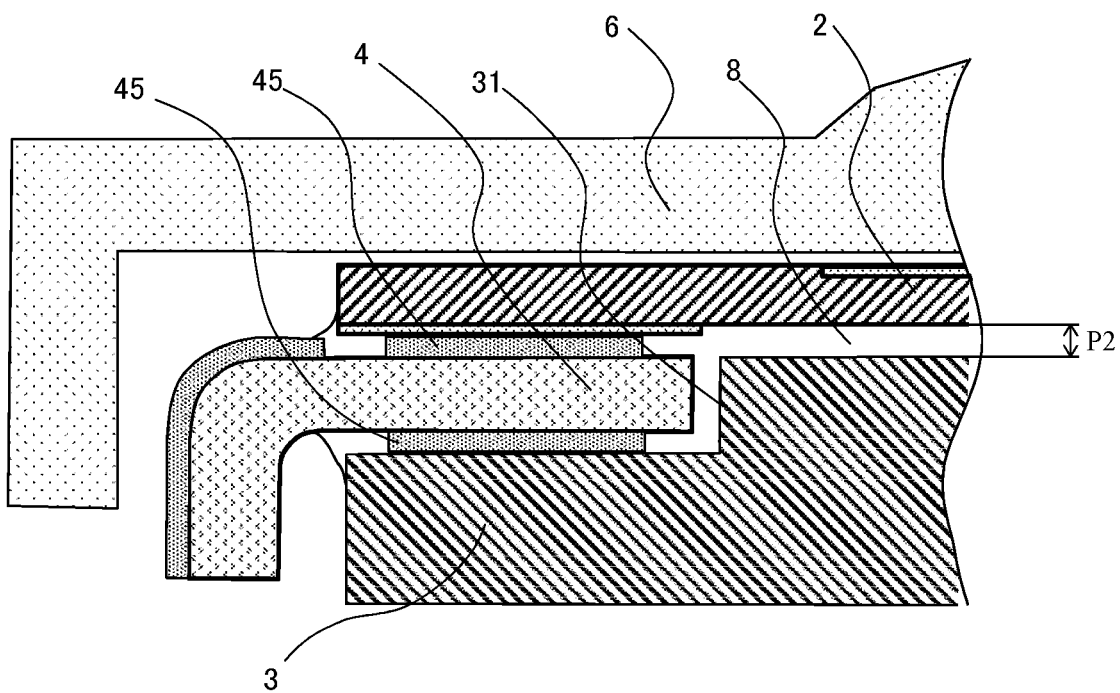
FIGS. 19A and 19B illustrate a modification of the ultrasonic probe according to the sixth embodiment where
Figure 19B:
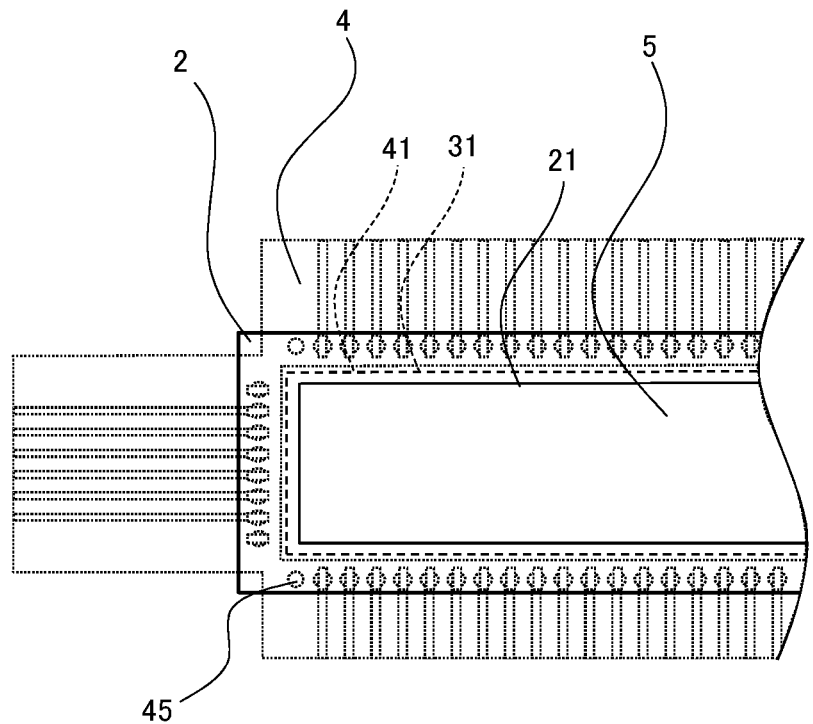

In FIGS. 17 and 18, there is described an example where the top surface of the backing material 3 (the surface bonded to the FPC 4) is flat. In the present modification, as shown in FIGS. 19A and 19B, the backing material 3 being employed has a level difference 31 along the opening 41 of the FPC 4, and has a cross section shape with a central part being raised relative to a circumferential part. This raised central part 31 of the backing material 3, is bonded to the undersurface of the element unit 21 of the CMUT chip 2 positioned above, via the opening 41 of the FPC 4.

This level difference 31 reduces the clearance P2 between the CMUT chip 2 and the backing material 3, and it is smaller than the clearance P1 between the CMUT chip 2 and the backing material 3 as shown in FIG. 17B. Consequently, the adhesive layer 8 filled in the clearance is made thinner, and holding the CMUT chip 2 is stabilized more. In addition, an effect produced by the backing material is enhanced more. In other words, due to this configuration, ultrasonic waves discharged toward the backside of the CMUT chip cannot be reflected easily by the surface of the backing material, and thus noise is reduced.

Since the level difference 31 is provided on the backing material 3, the bonding part between the CMUT chip 2 and the FPC 4 is absorbed by this level difference, reducing protrusion from the surface of the backing material 3. Thus, when the bonding part is closely adhered, no excessive clearance is made between the CMUT chip 2 and the backing material 3, and uniform pressure is applied when bonding the FPC 4 to the CMUT chip 2, whereby an effect further reducing warping and deforming of the FPC 4 can be produced.

The ultrasonic probe according to aforementioned embodiments of the present invention has been described, taking the probe of the ultrasonic diagnostic system as an example. However, the ultrasonic probe of the present invention is not restricted to the ultrasonic probe used for the ultrasonic diagnostic system. The present invention is applicable, for any cases that use the ultrasonic probe having a structure where a chip with ultrasonic elements formed for transmitting and receiving ultrasonic waves is bonded to a flexible printed circuit (FPC) with signal lines formed for delivering drive signals to the ultrasonic elements, and receiving ultrasonic signals from the ultrasonic elements.

Embodiments of the ultrasonic probe according to the present invention include various modifications, without limited to those as described above. For example, the aforementioned embodiments describe the present invention in detail for easy understanding of the invention. Thus, the present invention is not limited to the configuration provided with all the components described above. A part of the configuration of one embodiment may be replaced by the configuration of any other embodiment, and the configuration of one embodiment may be added to the configuration of any other embodiment. In addition, with regard to a part of the configuration of each embodiment, the corresponding part may be added, deleted, or replaced in the configuration of any other embodiment.

In each of the embodiments, the pads, bumps, and wiring (conductive members) are illustrated for the sake of explanation, and thus, all of the pads, bumps, and wiring (conductive member) required for commercialization are not necessarily illustrated. In actuality, it is conceivable that almost all the components be connected mutually. The number of bumps and pads formed on the CMUT chip 2 of the aforementioned embodiments may not be limited to the number as illustrated in the figures. Any number of each component may be provided, in response to the size and resolution of the ultrasonic element.

Embodiments of Ultrasonic System

Next, there will be described embodiments of an ultrasonic system according to the present invention.

Seventh Embodiment

Figure 20:
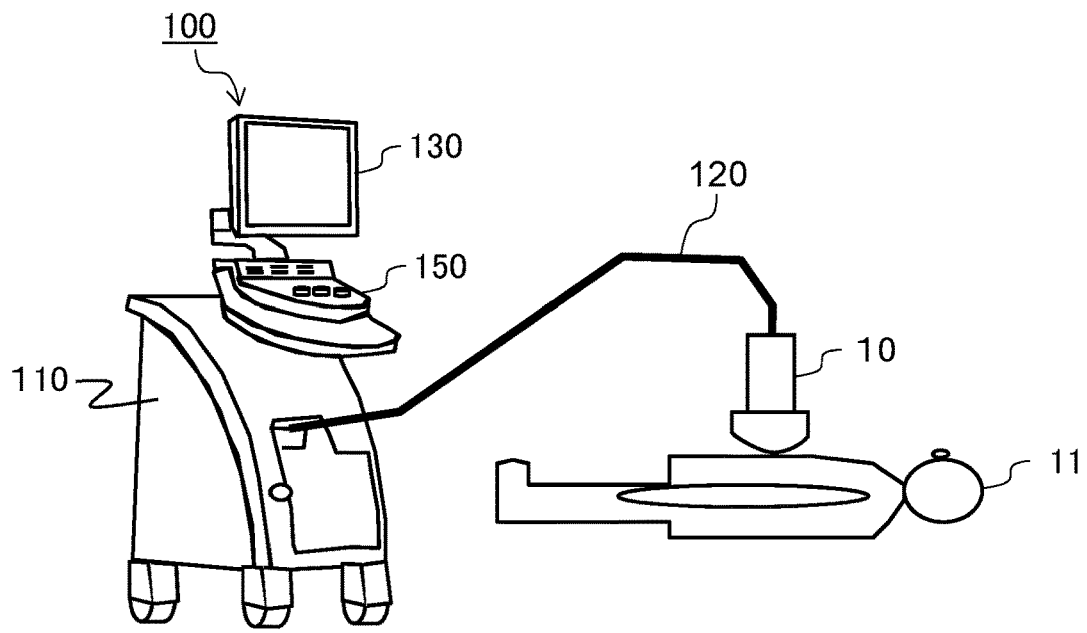
FIG. 20 illustrates a schematic configuration of an ultrasonic diagnostic system to which the present invention directed to the ultrasonic probe is applied.
Figure 21:
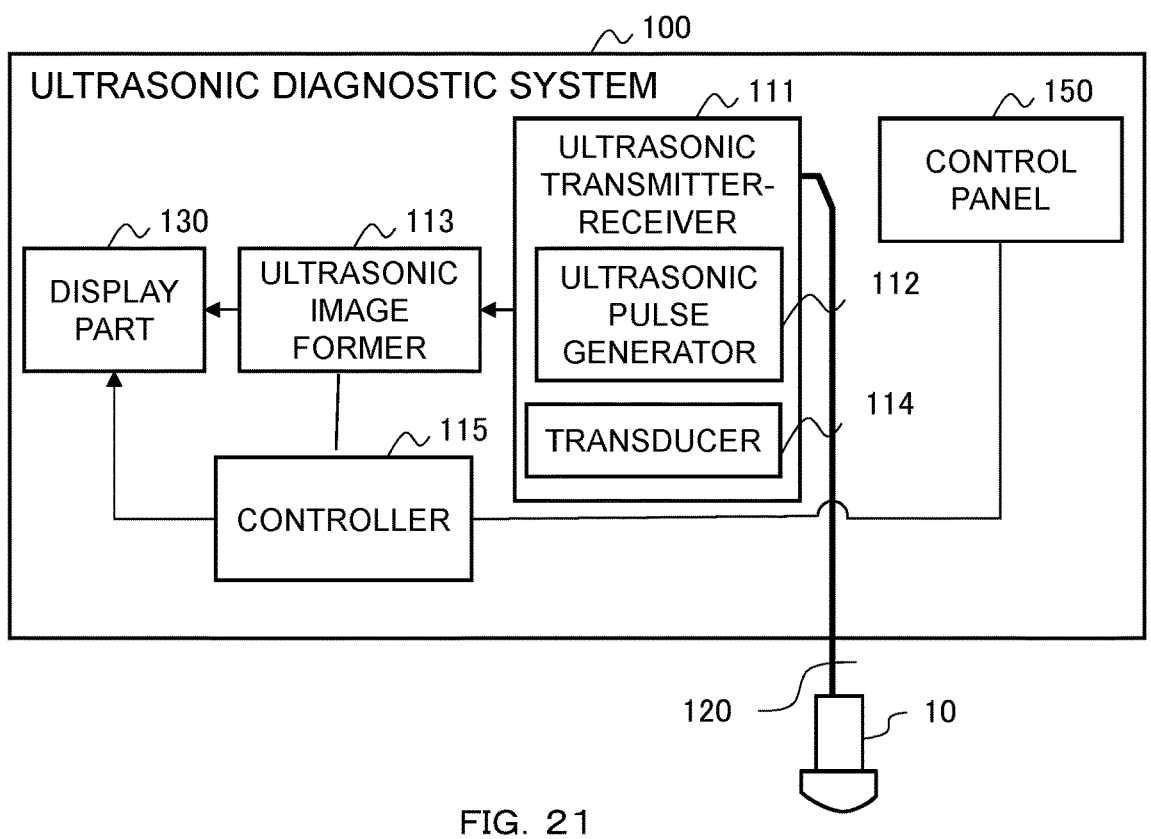
FIG. 21 is a block diagram showing a configuration of the ultrasonic diagnostic system of FIG. 20.

With reference to FIGS. 20 and 21, embodiments of the ultrasonic system will be described, taking the ultrasonic diagnostic system as an example. FIG. 20 is a schematic external view showing a use condition of the ultrasonic diagnostic system according to the present embodiment, and FIG. 21 is block diagram showing the main unit of the system.

The ultrasonic diagnostic system 100 as illustrated in FIG. 20 is provided with a main unit 110, a display part 130 for displaying an ultrasonic image, and others, and a control panel 150 for an operator (not illustrated) to input examination conditions and other information into the main unit 110. The ultrasonic probe 10 is connected to the main unit 110 via the cable 120, applies ultrasonic waves to the subject 11, and receives ultrasonic signals being reflected waves.

The ultrasonic probe 10 has a structure where a chip with ultrasonic elements formed for transmitting and receiving ultrasonic waves is bonded to a printed-circuit board (FPC) with signal lines formed for delivering drive signals to the ultrasonic elements and receiving ultrasonic signals from the ultrasonic elements. Specifically, the probe has a structure where the CMUT chip 2 and the FPC 4 are bonded, as described in the aforementioned embodiments, and the acoustic lens 6 is fixed on the top surface of the CMUT chip 2.

As shown in FIG. 21, the main unit 110 incorporates an ultrasonic transmitter-receiver 111 configured to transmit ultrasonic signals to and receive ultrasonic signals from the ultrasonic probe 10, an ultrasonic image former 113 configured to form an ultrasonic image such as a B-mode image by using the ultrasonic signals received by the ultrasonic transmitter-receiver 111, and a controller 115 configured to control operations of the ultrasonic transmitter-receiver 111 and of the ultrasonic image former 113.

The ultrasonic transmitter-receiver 111 generates pulse-like electrical signals to produce ultrasonic signals in the ultrasonic probe 10, so as to be transmitted to the subject 11. The ultrasonic transmitter-receiver 111 is provided with an ultrasonic pulse generator 112 configured to transmit thus generated electrical signals to the ultrasonic probe 10, and a transducer 114 configured to transform echo signals received in the ultrasonic probe 10 to electrical signals. The ultrasonic transmitter-receiver 111 may be any commercially available ultrasonic transmitter-receiver device, for instance.

The ultrasonic image former 113 forms from the electrical signals transformed from the echo signals, a two-dimensional ultrasonic image, a three-dimensional ultrasonic image, various Doppler image, or similar images. Specifically, the ultrasonic image former 113 comprises, for example, a CPU (Central Processing Unit), a microcomputer, and others.

The controller 115 controls the aforementioned components, on the basis of control information entered via the control panel 150. Specifically, the controller 115 comprises, for example, a CPU (Central Processing Unit), a microcomputer, and others. The CPU or the microcomputer constituting the ultrasonic image former 113 may also function as the controller 115.

The display part 130 displays the ultrasonic image formed by the ultrasonic image former 113. The display part 130 further displays the information entered via the control panel 150, and other information necessary for the examination. Specifically, the display part 130 comprises an LCD (Liquid Crystal Display), a monitor unit, and others.

The control panel 150 is provided for an operator to enter any information, so that the operator can perform a desired examination on the subject 11. Specifically, the control panel comprises push buttons, a touch panel for sensing variations of capacitance, and others.

With this configuration as described above, the ultrasonic probe 10 receives a control signal from the ultrasonic diagnostic system (main unit) 110, and transmits an ultrasonic signal to the subject 11. Then, the ultrasonic probe 10 receives the ultrasonic signal reflected from the subject 11 as an echo. The ultrasonic probe 10 transmits the ultrasonic signal thus received (received signal) to the ultrasonic diagnostic system 110. The ultrasonic image former 113 generates images from thus received ultrasonic signals, such as a two-dimensional ultrasonic image, a three-dimensional ultrasonic image, and various Doppler images of a portion to be examined of the examinee. The display part 130 displays such various types of images. Then, the ultrasonic diagnostic system 100 visualizes the inside of the body of the subject 11, allowing the operator to perform examination.

The ultrasonic diagnostic system of the present embodiment uses the ultrasonic probe 10 according to the present invention, being mechanically and electrically stable, and this allows obtainment of a stable and favorable image.

Eighth Embodiment

There will be described an eighth embodiment directed to an ultrasonic transmitter-receiver system (ultrasonic diagnostic system) that uses the ultrasonic probe of the present invention, being connected to a cellular phone or to a tablet.

Figure 22A:
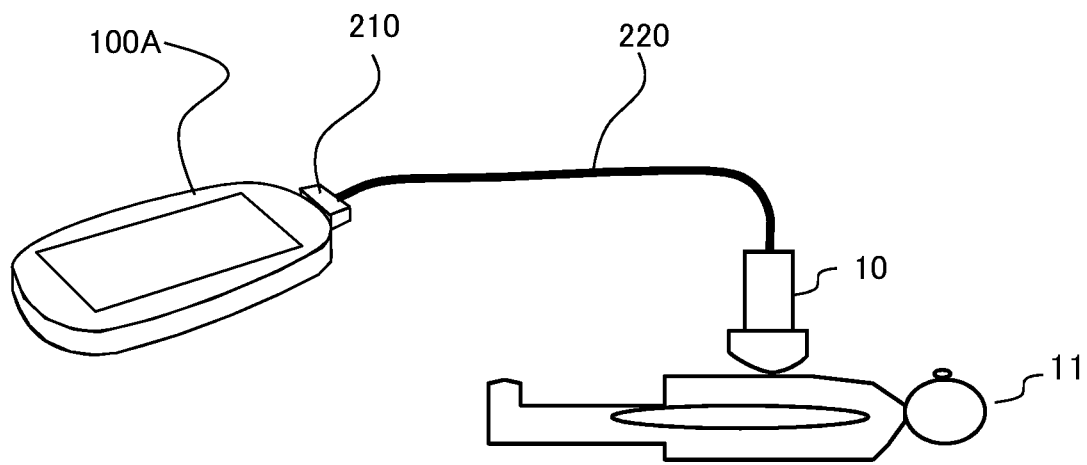
FIGS. 22A and 22B illustrate examples of an ultrasonic examination system to which the present invention directed to the ultrasonic probe is applied.

FIG. 22A shows a schematic external view of a configuration for performing an ultrasonic examination on the subject 11, by connecting the ultrasonic probe 10 to a cellular phone 100A. The ultrasonic probe 10 corresponds to the ultrasonic probe according to any of the first to the seventh embodiments.

The cellular phone 100A is equipped with a connector 210 to establish connection with a connector for an external connection (not illustrated). The connector 210 is connected to the tip of the cable 220 that is connected to the ultrasonic probe 10.

There is installed in the cellular phone 100A, application software having a function to transmit ultrasonic waves to and receive ultrasonic waves from the ultrasonic probe 10, a function for transforming the signals received by the ultrasonic probe 10 into an image, and displaying thus obtained image, and other functions. According to the application software, a mode for transmitting and receiving the ultrasonic waves is adequately adjusted so as to display an ultrasonic image on the screen of the cellular phone 100A.

The cellular phone 100A transmits thus acquired image information to a cloud service used for medical examination, or a similar server, via wireless or wired communication, and then accurate examination or diagnosis can be provided with the use of artificial intelligence (AI) such as machine learning. When there are obtained disease findings by the examination and others, it is possible to pull information such as a treatment method and effective dosage, according to AI.

Figure 22B:
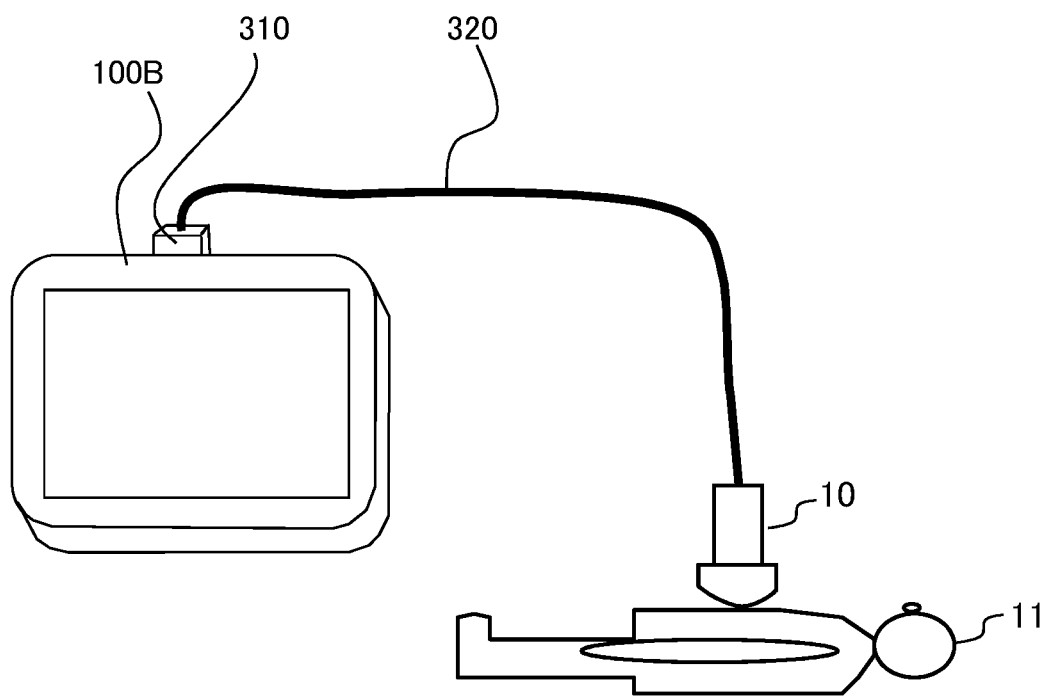

FIG. 22B is an external view of the configuration where the ultrasonic probe 10 is connected to the tablet terminal 100B to perform ultrasonic examination on the subject 11. The ultrasonic probe 10 corresponds to the ultrasonic probe according to any of the first to the seventh embodiments.

The external connector (not illustrated) of the tablet terminal 100B is equipped with the connector 310 to establish connection with the ultrasonic probe 10. The connector 310 is further connected to the tip of the cable 320 that is connected to the ultrasonic probe 10.

There is installed in the tablet terminal 100B, application software having a function to transmit ultrasonic waves to and receive ultrasonic waves from the ultrasonic probe 10, a function for transforming the signals received by the ultrasonic probe 10 into an image, and displaying the image, and other functions. The ultrasonic examination using the tablet terminal is similar to the ultrasonic examination using the cellular phone 100A as shown in FIG. 22A, including the support of examination using the application software and AI technology, and the usage of cloud servers.

There have been described embodiments of the ultrasonic system according to the present invention, and the present invention further includes various modifications without limited to those embodiments as described above. For example, the main unit of the diagnostic system according to the aforementioned embodiments may be replaced by an ultrasonic examination system, and by modifying programs installed in the cellular phone or in the tablet, it may also be utilized as an ultrasonic sensor.

What is claimed is:

1. An ultrasonic probe comprising,
a chip having a plurality of ultrasonic elements and a plurality of connecting terminals respectively connected thereto, and
a flexible printed circuit having an opening for exposing the plurality of ultrasonic elements and provided with pads along the opening, respectively associated with the plurality of connecting terminals, wherein,
the connecting terminals and the pads are connected by press-fitting bumps provided on the connecting terminals into via holes provided in the pads, and
a first area on a surface of the flexible printed circuit, facing to a second area of the chip where no connecting terminal is formed, is provided with a stiffness reinforcement for increasing stiffness of the flexible printed circuit.

2. The ultrasonic probe according to claim 1, wherein,
the stiffness reinforcement is formed in a process of forming the pads on the flexible printed circuit, and the stiffness reinforcement has the same thickness as the pad.

3. The ultrasonic probe according to claim 1, wherein,
both surfaces of the flexible printed circuit are provided with the stiffness reinforcement.

4. The ultrasonic probe according to claim 1, wherein,
the stiffness reinforcement being adjacent to the pads, is a dummy pad that does not contribute to a signal line.

5. The ultrasonic probe according to claim 1, wherein,
the opening of the flexible printed circuit has a quadrilateral shape when viewed from the top, and the stiffness reinforcement is formed at each of four corners of the quadrilateral shape.

6. The ultrasonic probe according to claim 5, wherein,
the stiffness reinforcement has a hook-like shape.

7. The ultrasonic probe according to claim 6, wherein,
the stiffness reinforcement has an opening used for alignment with the chip.

8. The ultrasonic probe according to claim 1, wherein,
the flexible printed circuit has a ground line for grounding, and the stiffness reinforcement is connected to the ground line.

9. The ultrasonic probe according to claim 1, wherein,
the ultrasonic elements and the connecting terminals are formed on the same surface of the chip, and the flexible printed circuit is bonded to the chip in a manner that covers the top surface of the connecting terminals.

10. The ultrasonic probe according to claim 1, wherein,
the connecting terminals are formed on the undersurface of the chip, with the ultrasonic elements formed on the top surface thereof, and the flexible printed circuit is bonded to the undersurface of the chip.

11. The ultrasonic probe according to claim 10, further comprising a backing material fixed on the underside of the flexible printed circuit, wherein,
the backing material is positioned below the chip, through the opening of the flexible printed circuit.

12. The ultrasonic probe according to claim 11, wherein,
the backing material has a level difference between an area facing the ultrasonic elements and a surrounding area thereof, on a contact surface with the flexible print circuit, and the area facing the ultrasonic elements is accommodated in the opening of the flexible printed circuit.

13. The ultrasonic probe according to claim 1, wherein,
the flexible print circuit comprises bands that are bent to serve as side surfaces, with respect to the surface connected to the chip, and
the ultrasonic probe further comprises an acoustic lens covering the ultrasonic elements on the chip and the side surfaces of the flexible print circuit.

14. The ultrasonic probe according to claim 1 is an ultrasonic probe of an ultrasonic diagnostic system.

15. An ultrasonic transmitter-receiver system, comprising, an ultrasonic transmitter-receiver configured to transmit an ultrasonic signal to an ultrasonic probe coming into contact with a test subject, and to receive a signal from the ultrasonic probe, and an ultrasonic image former configured to form an image of the test subject by using the signal received by the ultrasonic transmitter-receiver, wherein, the ultrasonic probe according to claim 1 is used as the ultrasonic probe.

* * * * *